United States Patent
Yanagisawa

(10) Patent No.: US 8,617,912 B2
(45) Date of Patent: Dec. 31, 2013

(54) METHOD FOR MANUFACTURING SEMICONDUCTOR LASER

(75) Inventor: Masaki Yanagisawa, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 14 days.

(21) Appl. No.: 13/529,093

(22) Filed: Jun. 21, 2012

(65) Prior Publication Data

US 2013/0005062 A1 Jan. 3, 2013

(30) Foreign Application Priority Data

Jul. 1, 2011 (JP) .................... 2011-147650

(51) Int. Cl.
*H01L 21/00* (2006.01)

(52) U.S. Cl.
USPC ............ 438/32; 438/16; 438/29; 438/31; 438/39; 438/43; 257/E21.158

(58) Field of Classification Search
None
See application file for complete search history.

(56) References Cited

U.S. PATENT DOCUMENTS

2010/0297795 A1* 11/2010 Ishihara .............. 438/31

FOREIGN PATENT DOCUMENTS

JP 2009-53271 3/2009

OTHER PUBLICATIONS

M. W. Lin et al., "Planarization for reverse-tone step and flash imprint lithography", Proceedings of SPIE 6151, pp. 61512G (2006).

* cited by examiner

*Primary Examiner* — Kyoung Lee
(74) *Attorney, Agent, or Firm* — Smith, Gambrell & Russell, LLP

(57) ABSTRACT

A method for manufacturing a semiconductor laser includes the steps of preparing a mold with a pattern surface having recesses, forming a stacked semiconductor layer including a grating layer, forming a resin part on the grating layer, forming a resin pattern portion on the resin part, forming a diffraction grating by etching the grating layer using the resin part as a mask, and forming a mesa-structure on the stacked semiconductor layer. Each of the recesses includes two end portions and a middle portion between the two end portions. A depth of at least one of the two end portions from the pattern surface is greater than that of the middle portion. The step of forming the mesa-structure includes the step of etching the stacked semiconductor layer so as to remove end portions of the diffraction grating in a direction orthogonal to a periodic direction thereof.

9 Claims, 18 Drawing Sheets

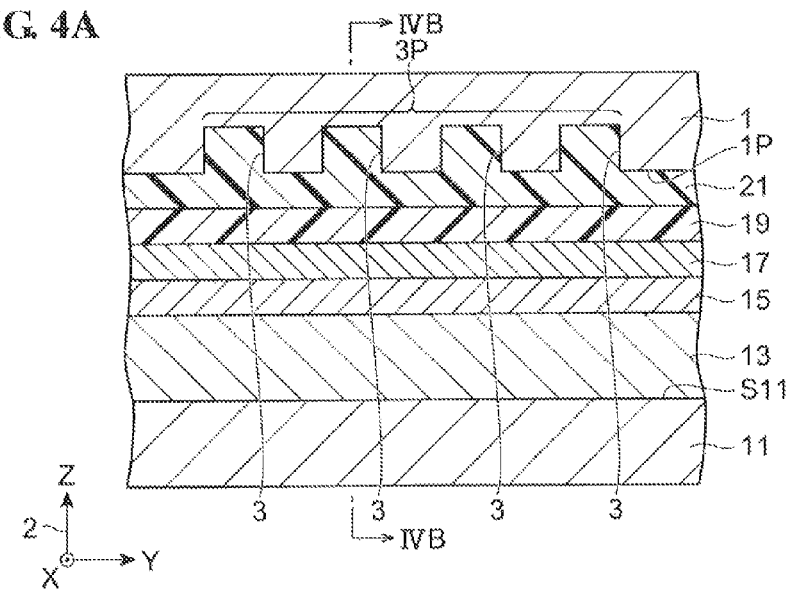
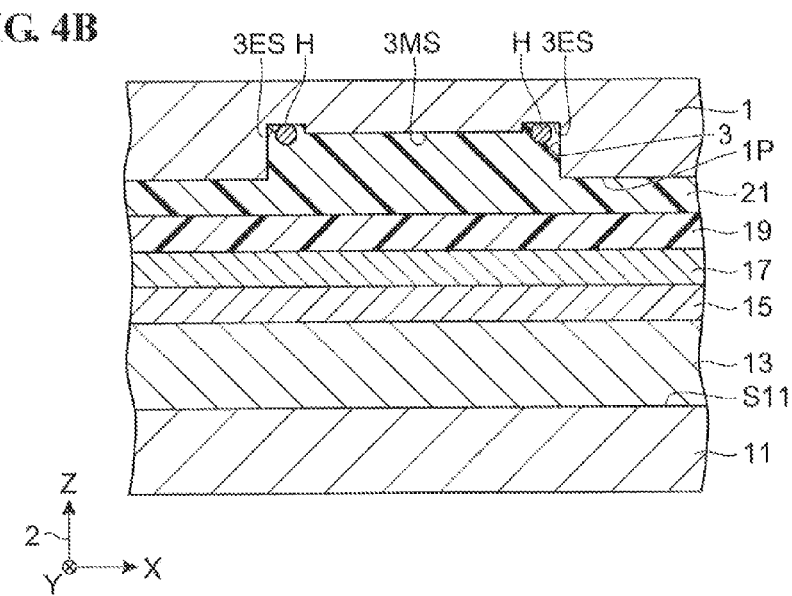

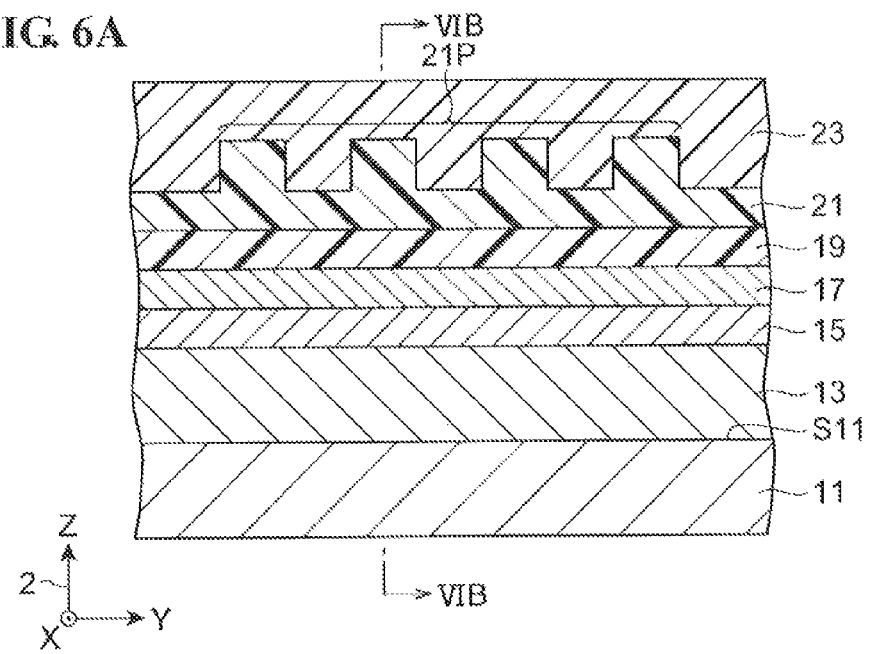
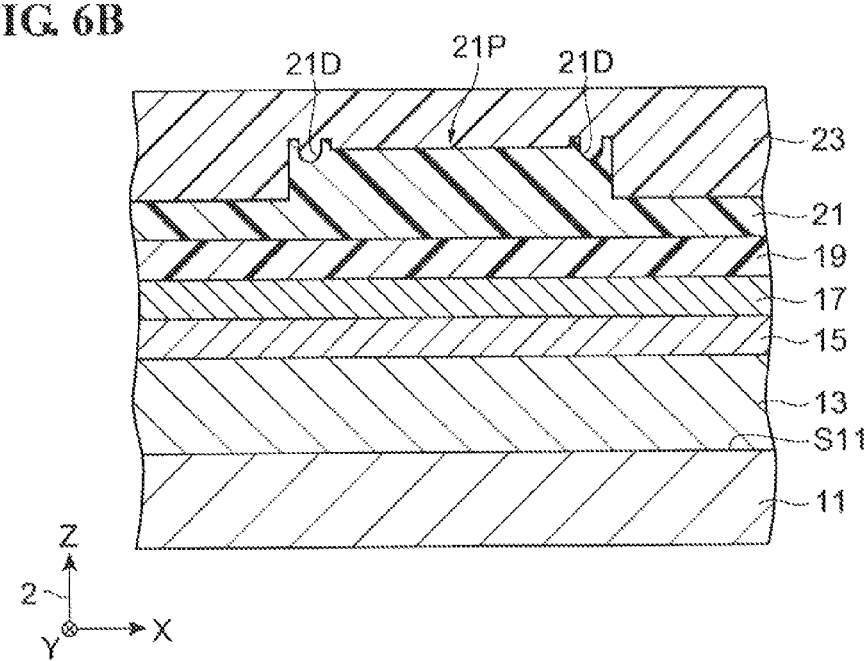

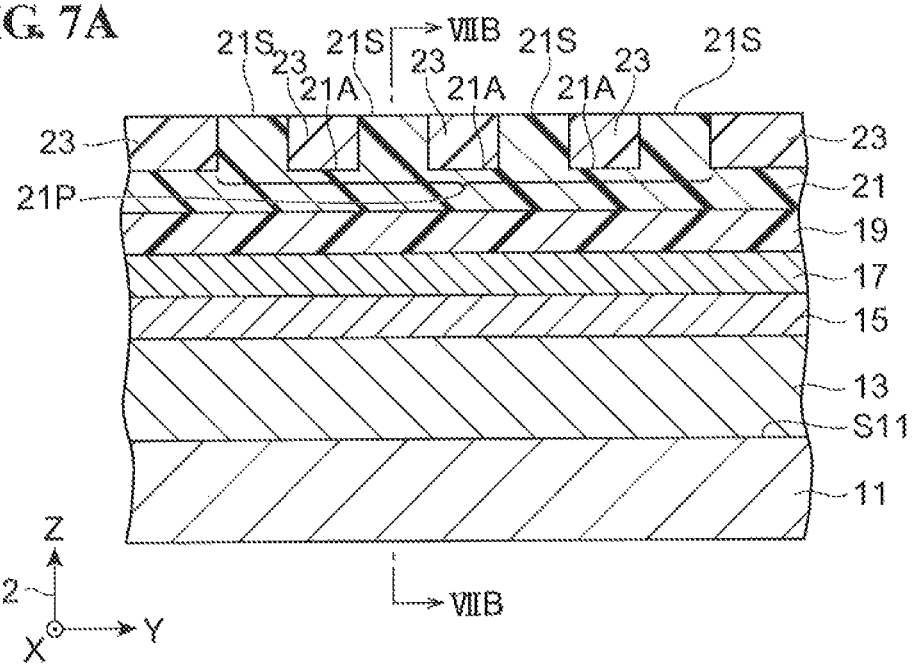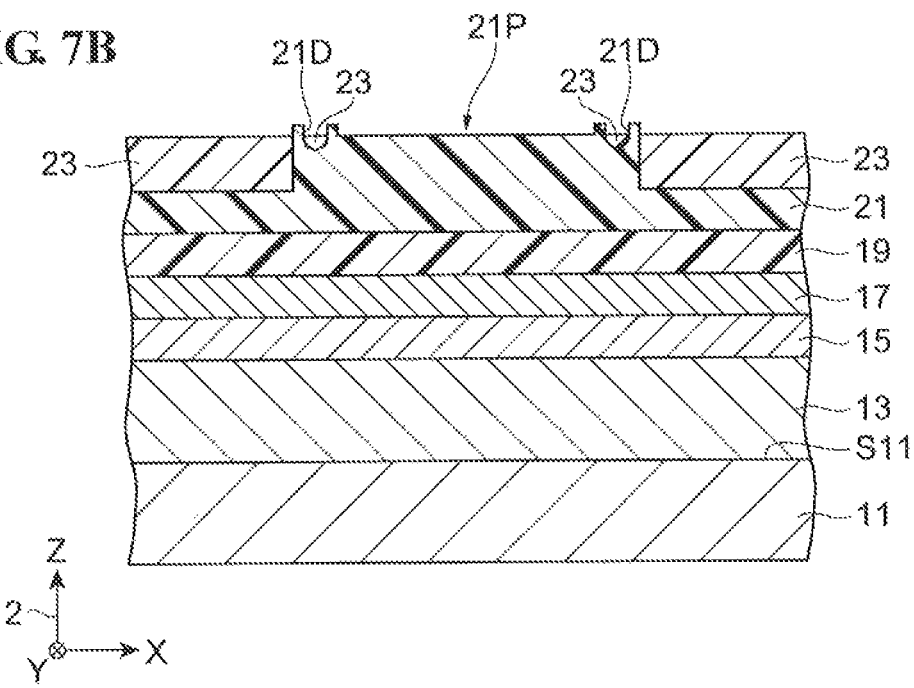

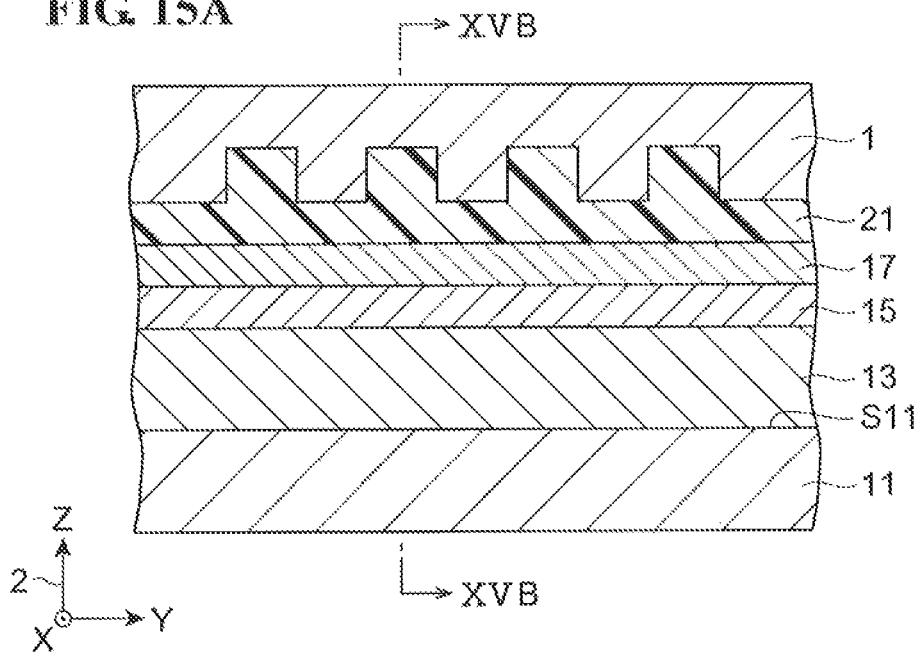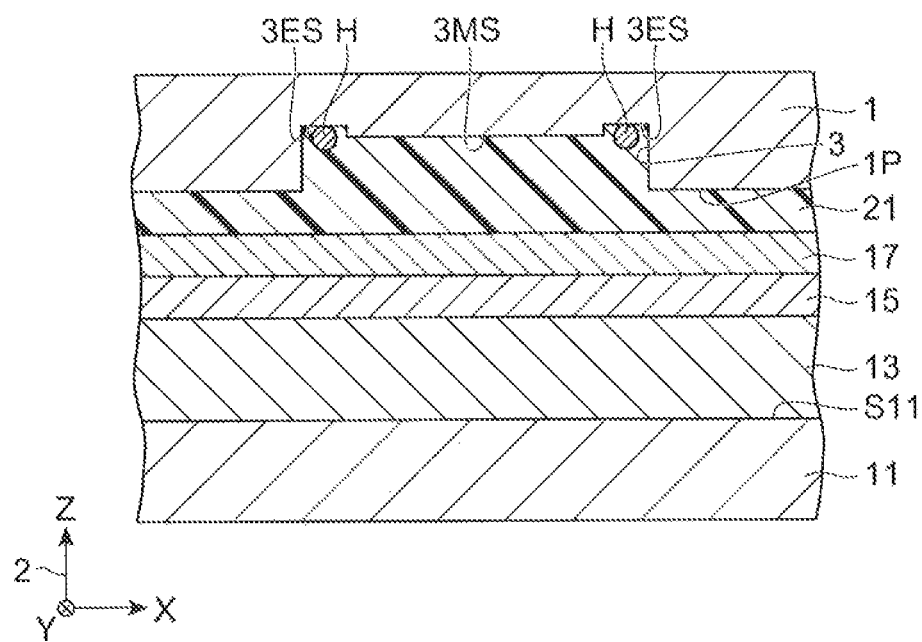

METHOD FOR MANUFACTURING SEMICONDUCTOR LASER

BACKGROUND OF THE INVENTION

1. Field of the Invention

The present invention relates to a method for manufacturing a semiconductor laser.

2. Description of the Related Art

Japanese Unexamined Patent Application Publication No. 2009-53271 describes a method for manufacturing a distributed feedback laser diode by using a nano-imprint technique. In this method, a semiconductor layer is patterned by the nano-imprint technique to form a diffraction grating of a distributed feedback laser diode. Also, a microfabrication method in which a nano-imprint technique is used is described in M. W. Lin, et. al., "Planarization for Reverse-Tone Step and Flash Imprint Lithograph", Proceedings of SPIE 6151, pp. 61512G (2006).

The nano-imprint technique has been studied to apply it to a semiconductor process of forming a diffraction grating in a semiconductor laser. The manufacturing cost of devices such as semiconductor lasers can be reduced by forming the diffraction grating by the nano-imprint technique.

To form a diffraction grating in a semiconductor laser by the nano-imprint technique, first, a semiconductor layer on which the diffraction grating is to be formed and a resin part are formed on a semiconductor substrate in that order. Then, a mold having a pattern surface is pressed against the resin part. A pattern of the diffraction grating having periodic projections and recesses is formed on the pattern surface of the mold. Next, the resin part is hardened in that state. Subsequently, the mold and the resin part are detached from each other. Thus, the pattern of the diffraction grating formed on the pattern surface of the mold is transferred onto the resin part, so that a resin pattern portion is formed on the resin part.

Subsequently, the semiconductor layer is etched by using the resin pattern portion, so that the pattern formed in the resin pattern portion is transferred onto the semiconductor layer. Thus, the diffraction grating is formed on the semiconductor layer.

However, in the above-described method for manufacturing a diffraction grating by the nano-imprint technique, air may remain between the resin part and the recesses in the pattern surface of the mold when the pattern surface is pressed against the resin layer. Consequently, gas bubbles may become trapped between the resin part and the recesses in the pattern surface. If the resin part is hardened in such a state, the shape of the recesses in the mold cannot be appropriately transferred onto the resin part. As a result, defects are easily formed in the diffraction grating on the semiconductor layer.

SUMMARY OF THE INVENTION

A method for manufacturing a semiconductor laser according to an aspect of the present invention includes the steps of preparing a mold having a pattern surface on which a pattern including a plurality of recesses is formed; forming a stacked semiconductor layer on a principal surface of a substrate, the stacked semiconductor layer including an active layer and a grating layer; forming a resin part on the grating layer; forming a resin pattern portion having recesses on the resin part by transferring the pattern formed on the pattern surface of the mold onto the resin part by a nano-imprint technique using the mold; forming a diffraction grating in the grating layer by etching the grating layer using the resin part on which the resin pattern portion is formed as a mask; and forming a mesa-structure on the stacked semiconductor layer by etching the stacked semiconductor layer. The recesses in the mold extend in a first direction that is parallel to the pattern surface and are periodically arranged in a second direction that is orthogonal to the first direction, each of the recesses in the mold including two end portions in the first direction and a middle portion between the two end portions, a depth of at least one of the two end portions from the pattern surface being greater than a depth of the middle portion from the pattern surface. In the step of forming the resin pattern portion, the recesses formed in the resin part are periodically arranged in a third direction that is parallel to the principal surface of the substrate. In the step of forming the diffraction grating, the diffraction grating has two end portions in a direction orthogonal to the third direction corresponding to the pattern formed on the pattern surface of the mold. In addition, the step of forming the mesa-structure includes the steps of covering a part of a top surface of the stacked semiconductor layer with a mask that does not cover the top surface of the stacked semiconductor layer over the end portions of the diffraction grating, the mask extending in the third direction, and etching the stacked semiconductor layer using the mask so as to remove the end portions of the diffraction grating.

In the method for manufacturing the semiconductor laser according to the present invention, the recesses in the mold are periodically arranged in the second direction. Therefore, after the stacked-semiconductor-layer forming step, the resin-part forming step, and the resin-pattern-portion forming step, the resin pattern portion having the recesses that are periodically arranged along the third direction, which is parallel to the principal surface of the semiconductor substrate, is formed on the resin part.

Each of the recesses in the mold includes the two end portions in the first direction and the middle portion between the two end portions. In each of the recesses in the mold, the depth of at least one of the two end portions from the pattern surface is greater than the depth of the middle portion from the pattern surface. When the pattern surface of the mold is pressed against the resin part in the pressing step, gas bubbles are trapped between the resin part and the recesses in the mold. In such a case, the gas bubbles easily move to the at least one of the two end portions of each of the recesses in the first direction.

Therefore, defects of the resin pattern portion due to the gas bubbles tend to be formed at the end portions of the resin pattern portion in the direction orthogonal to the third direction. The diffraction grating is formed by transferring the shape of the resin pattern portion onto the grating layer. Therefore, defects of the diffraction grating due to the gas bubbles tend to be formed at the end portions of the diffraction grating in the direction orthogonal to the third direction.

In the etching step in the mesa-structure forming step, the stacked semiconductor layer is etched so as to remove the end portions of the diffraction grating in the direction orthogonal to the third direction. Therefore, the defects of the diffraction grating due to the gas bubbles can be easily removed when the stacked semiconductor layer is etched. As a result, in the semiconductor laser, the defects of the diffraction grating due to the gas bubbles can be reduced.

In the method for manufacturing a semiconductor laser according to the aspect of the present invention, the step of forming the resin pattern portion on the resin part may include the steps of pressing the pattern surface of the mold against the resin part, hardening the resin part while the resin part and the pattern surface of the mold are maintained in contact with each other, and detaching the mold and the resin part from each other.

In the method for manufacturing a semiconductor laser according to the aspect of the present invention, the step of pressing the pattern surface of the mold against the resin part is preferably performed in a reduced-pressure atmosphere. In this case, when the pattern surface of the mold is pressed against the resin part in the pressing step, the amount of gas bubbles trapped between the resin part and the recesses in the mold can be reduced. As a result, the defects of the diffraction grating can be more effectively reduced.

In the method for manufacturing a semiconductor laser according to the aspect of the present invention, a surface of the mold that defines the middle portion of each of the recesses may be substantially parallel to the pattern surface. Accordingly, in the resin pattern portion formed by transferring the shape of the recesses onto the resin part, the depth distribution of each of the recesses in the resin pattern portion can be made uniform. As a result, when the diffraction grating is formed on the grating layer by transferring the shape of the resin pattern portion onto the grating layer, the depth distribution of each of the recesses in the diffraction grating can be made uniform.

In the method for manufacturing a semiconductor laser according to the aspect of the present invention, a surface of the mold that defines the middle portion of each of the recesses may include an area including at least one of ends of the surface in the first direction. Each of the recesses in the mold preferably has a shape such that a depth thereof from the pattern surface in the area increases toward the at least one of the ends along the first direction.

In this case, when the pattern surface of the mold is pressed against the resin part in the pressing step, the gas bubbles trapped between the resin part and the recesses in the mold more easily move to the at least one of the two end portions of each of the recesses in the first direction.

In the method for manufacturing a semiconductor laser according to the aspect of the present invention, a surface of the mold that defines at least one of the two end portions of each of the recesses is preferably inclined with respect to the pattern surface in the first direction.

In this case, when the pattern surface of the mold is pressed against the resin part in the pressing step, the gas bubbles trapped between the resin part and the recesses in the mold more easily move to the at least one of the two end portions of each of the recesses in the first direction.

In the method for manufacturing a semiconductor laser according to the aspect of the present invention, the step of forming the resin part may include the step of forming an insulating layer on the grating layer, the resin part being formed on the insulating layer. In addition, the step of forming the diffraction grating in the grating layer preferably includes the steps of etching the insulating layer using the resin part on which the resin pattern portion is formed as a mask until a part of a surface of the grating layer is exposed, and etching the grating layer using the insulating layer as a mask.

In the method for manufacturing a semiconductor laser according to the aspect of the present invention, the resin part may be made of a silicon-non-containing resin. The step of forming the resin pattern portion preferably includes the steps of forming a silicon-containing-resin layer on the resin part, the silicon-containing-resin layer filling the recesses formed in the resin pattern portion, etching the silicon-containing-resin layer until a surface of the resin pattern portion is exposed while the silicon-containing-resin layer remains in the recesses in the resin pattern portion, and forming an inverted resin pattern portion, which has an inverted shape of the resin pattern portion, on the resin part by etching the resin part using the silicon-containing-resin layer that remains in the recesses in the resin pattern portion as a mask until a part of a surface of the grating layer is exposed. In addition, the step of forming the diffraction grating in the grating layer preferably includes the step of etching the grating layer using the resin part having the inverted resin pattern portion as a mask.

To transfer the projection-and-recess pattern including recesses formed on the resin pattern portion onto the grating layer, first, the silicon-containing-resin layer, and the resin part are selectively etched in that order. The selective etching may be performed by using the differences in the etching rate based on the differences in materials between the silicon-containing-resin layer and the resin part made of silicon-non-containing resin. Thus, the inverted shape of the resin pattern portion may be formed in the resin part. Then, the grating layer is etched using the resin part having the inverted resin pattern portion as a mask, so that the inverted shape of the resin pattern portion having the recesses is transferred onto the grating layer. As a result, the diffraction grating can be formed on the grating layer.

In the method for manufacturing a semiconductor laser according to the aspect of the present invention, the resin part may be made of a silicon-non-containing resin. In addition, the step of forming the resin part may include the step of forming an insulating layer on the grating layer, the resin part being formed on the insulating layer. The step of Forming the resin pattern portion may include the steps of forming a silicon-containing-resin layer on the resin part, the silicon-containing-resin layer filling the recesses formed in the resin pattern portion, etching the silicon-containing-resin layer until a surface of the resin pattern portion is exposed while the silicon-containing-resin layer remains in the recesses in the resin pattern portion, and forming an inverted resin pattern portion, which has an inverted shape of the resin pattern portion, on the resin part by etching the resin part using the silicon-containing-resin layer that remains in the recesses in the resin pattern portion as a mask until a part of a surface of the insulating layer is exposed. The step of forming the diffraction grating in the grating layer may include the steps of etching the insulating layer using the resin part having the inverted resin pattern portion as a mask until a part of a surface of the grating layer is exposed, and etching the grating layer using the insulating layer as a mask.

To transfer the projection-and-recess pattern including recesses formed on the resin pattern portion onto the grating layer, the step of forming the resin part may include the step of forming an insulating layer on the grating layer. The resin part may be formed on the insulating layer. Specifically, first, the silicon-containing-resin layer, the resin part, and the insulating layer are selectively etched in that order. The selective etching may be performed by using the differences in the etching rate based on the differences in materials between the silicon-containing-resin layer, the resin part made of silicon-non-containing resin, and the insulating layer. Thus, the inverted shape of the resin pattern portion may be transferred onto the insulating layer. Then, the grating layer is etched using the insulating layer as a mask, so that the inverted shape of the resin pattern portion having the recesses is transferred onto the grating layer. As a result, the diffraction grating can be formed on the grating layer.

As a result of the above-described selective etching of the silicon-containing-resin layer, the resin part, and the insulating layer, even when the surface of the mold that defines the middle portion of each of the recesses is inclined with respect to the pattern surface, the depth distribution of each of the recesses in the diffraction grating formed on the grating layer can be made substantially uniform.

BRIEF DESCRIPTION OF THE DRAWINGS

FIGS. 4A and 4B are sectional views illustrating a resin-pattern-portion forming step.

FIGS. 6A and 6B are sectional views illustrating the resin-pattern-portion forming step.

FIGS. 7A and 7B are sectional views illustrating the resin-pattern-portion forming step.

FIGS. 15A and 15B are sectional views illustrating a resin-part forming step according to a second embodiment.

DESCRIPTION OF THE PREFERRED EMBODIMENTS

Figure 1:
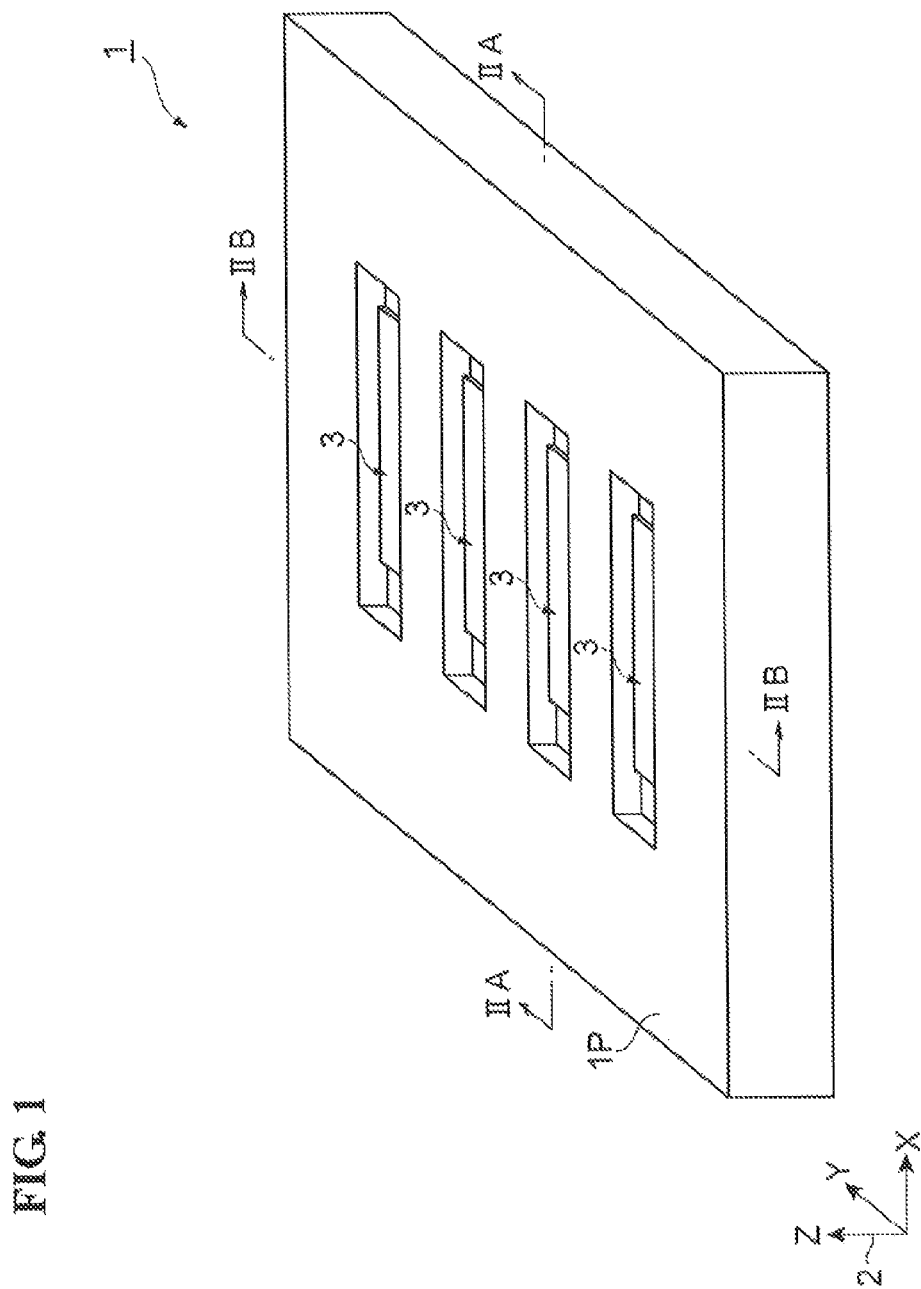
FIG. 1 is a perspective view of a nano-imprinting mold according to a first embodiment.

Methods for manufacturing a semiconductor laser according to embodiments will now be described in detail with reference to the drawings. In the drawings, similar components are denoted by the same reference numerals if possible. In addition, ratios of dimensions of each component and distances between the components in the drawings are drawn arbitrarily for simplicity.

First Embodiment

A method for manufacturing a distributed feedback laser diode will be described as a method for manufacturing a semiconductor laser according to a first embodiment. The method for manufacturing a distributed feedback laser diode according to the present embodiment mainly includes a mold preparation step, a stacked-semiconductor-layer forming step, and a mesa-structure forming step. Each step will be described in detail.

Mold Preparation Step

Figure 2A:
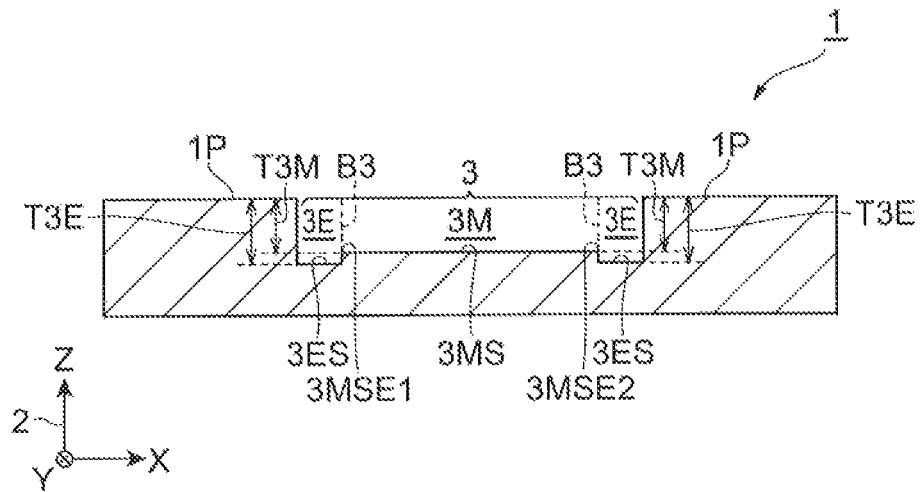
FIG. 2A is a sectional view of the nano-imprinting mold taken along line IIA-IIA in FIG. 1.
Figure 2B:
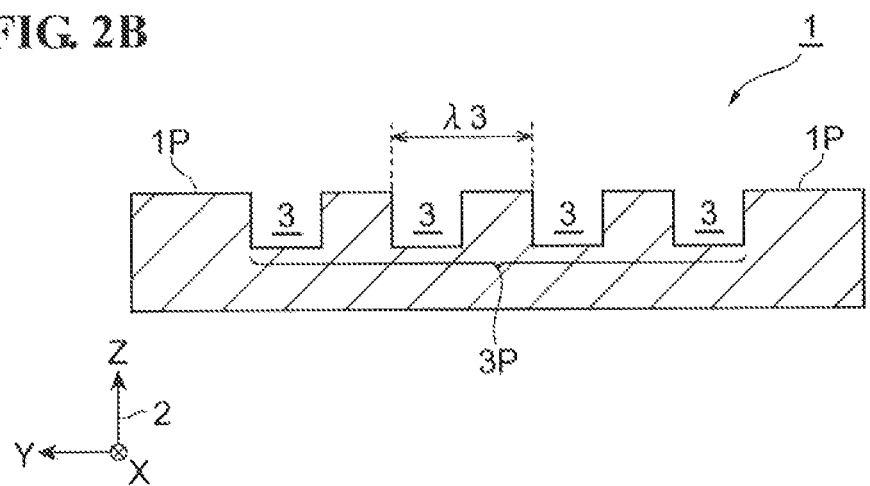
FIG. 2B is a sectional view of the nano-imprinting mold taken along line IIB-IIB in FIG. 1.
Figure 3A:
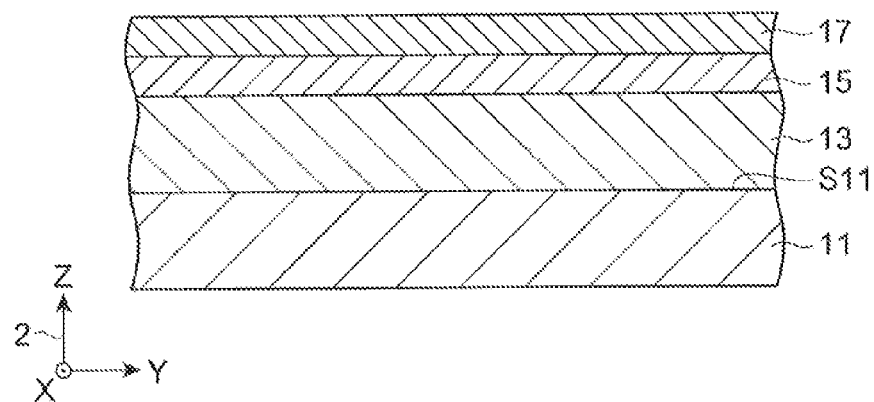
FIG. 3A is a sectional view illustrating a stacked-semiconductor-layer forming step.

In this step, a nano-imprinting mold is prepared. FIG. 1 is a perspective view of a nano-imprinting mold 1 according to a First embodiment. FIG. 2A is a sectional view of the nano-imprinting mold 1 taken along line IIA-IIA in FIG. 1. FIG. 2B is a sectional view of the nano-imprinting mold 1 taken along line IIB-IIB in FIG. 1. A rectangular coordinate system 2 is shown in FIGS. 1, 2A, and 2B. The rectangular coordinate system 2 is also shown in FIG. 3A and the following figures.

As illustrated in FIGS. 1, 2A, and 2B, the nano-imprinting mold 1 according to the present embodiment has a thickness in the Z-axis direction and includes a substantially flat pattern surface 1P that extends along the XY plane. The mold 1 is a rectangular-shaped flat plate.

The pattern surface 1P of the mold 1 has a pattern having periodic projections and recesses for forming a diffraction grating 17P (see FIGS. 10A and 10B) described below. The pattern formed on the pattern surface 1P includes a plurality of recesses 3. In this embodiment, the recess 3 has a stripe shape and extends in a first direction along the pattern surface 1P. In FIGS. 1, 2A, and 2B, the mold 1 is drawn such that the first direction is parallel to the X axis. The recesses 3 are periodically arranged with spaces therebetween in a second direction that is orthogonal to the first direction. In FIGS. 1, 2A, and 2B, the mold 1 is drawn such that the second direction is parallel to the Y axis. The second direction is a direction that is orthogonal to the first direction and extends along the pattern surface 1P.

As illustrated in FIG. 2A, each of the recesses 3 includes two end portions 3E in the first direction (X-axis direction) and a middle portion 3M between the two end portions 3E. A depth T3E of the two end portions 3E from the pattern surface 1P is greater than a depth T3M of the middle portion 3M from the pattern surface 1P. The two end portions 3E may instead be such that only one of the two end portions 3E has a depth from the pattern surface 1P that is greater than the depth T3M of the middle portion 3M from the pattern surface 1P. The two end portions 3E and the middle portion 3M are continuously connected to each other. In FIG. 2A, boundaries B3 between the middle portion 3M and the two end portions 3E are shown by broken lines.

In the present embodiment, a surface 3MS of the mold 1 that defines the middle portion 3M of each of the recesses 3 is substantially parallel to the pattern surface 1P. In other words, the depth T3M of the surface 3MS from the pattern surface 1P is constant from a first end 3MSE1 to a second end 3MSE2 in the first direction (X-axis direction). Surfaces 3ES of the mold 1 that define the two end portions 3E of each of the recesses 3 are also substantially parallel to the pattern surface 1P. The surface 3MS may instead be inclined such that the depth thereof from the pattern surface 1P increases toward the surfaces 3ES. Also, the surfaces 3ES may instead be inclined such that the depth from the pattern surface 1P increases or decreases toward the surface 3MS.

The depth T3M of the middle portion 3M of each of the recesses 3 may be, for example, 50 nm or more and 300 nm or less. The depth T3E of the two end portions 3E of each of the recesses 3 may be, for example, 60 nm or more and 400 nm or less. The difference between the depths T3M and T3E may be, for example, 10 nm or more and 100 nm or less. The length of each of the recesses 3 in the first direction (X-axis direction) may be, for example, 10 µm or more and 500 µm or less.

As described above, in the present embodiment, the plurality of recesses 3 are periodically arranged along the second direction. Thus, as illustrated in FIG. 2B, the pattern surface 1P has a line-and-space pattern 3P including space portions and line portions. The space portions correspond to the recesses 3. The line potions correspond to areas between the recesses 3 in the mold 1. The line-and-space pattern 3P has a periodic structure along the Y-axis direction. In other words, the periodic direction of the line-and-space pattern 3P is along the Y-axis direction. In FIGS. 1, 2A, and 2B, only four recesses 3 are illustrated for simplicity. However, the number of the recesses 3 is not particularly limited, and is typically 1,000 or more and 3,000 or less.

The line-and-space pattern 3P according to the present embodiment includes a plurality of line portions and space portions. The plurality of line portions extend in the X-axis direction, and have substantially the same width in the Y-axis direction and substantially the same height in the Z-axis direction; respectively. The plurality of space portions also extend in the X-axis direction, and have substantially the same width in the Y-axis direction and substantially the same height in the Z-axis direction, respectively. The line-and-space pattern 3P corresponds to the shape of the diffraction grating 17P (see FIGS. 10A and 10B) described below.

The height of the line portions and the height of the space portions in the Z-axis direction are equal to the depth T3M of the middle portion 3M of each of the above-described recesses 3. The width of the line portions and the width of the space portions in the Y-axis direction may be, for example, 70 nm or more and 200 nm or less. A pitch $\lambda 3$ of the line-and-space pattern 3P may be, for example, 150 nm or more and 400 nm or less.

The mold 1 is formed of for example, quartz, synthetic quartz, Si, or nickel. A nano-imprinting resin part, which will be described below, may be formed of an ultraviolet (UV) curing resin. In such a case, the mold 1 is preferably formed of a material such as quartz or synthetic quartz that has a sufficiently high transmittance for ultraviolet rays.

Stacked-Semiconductor-Layer Forming Step

Next, the stacked-semiconductor-layer forming step is performed. In the stacked-semiconductor-layer forming step, a grating layer that is a semiconductor layer in which a diffraction grating is to be formed is formed on a substrate. In this embodiment, the substrate is made of a semiconductor material. More specifically, as illustrated in FIG. 3A, a lower cladding layer 13, an active layer 15, and a grating layer 17 are formed in that order on a principal surface S11 of a semiconductor substrate 11 by an epitaxial growth method, such as a metal-organic vapor phase epitaxy (MOVPE) method. In FIG. 3A, the X and Y axes extend in directions parallel to the principal surface S11 of the semiconductor substrate 11.

The semiconductor substrate 11 is of a first conductive type (for example, n-type). The semiconductor substrate 11 is made of, for example, a III-V group compound semiconductor, such as InP, doped with Sn. The lower cladding layer 13 is a semiconductor layer of the first conductive type, and is made of, for example, a III-V group compound semiconductor, such as InP, doped with Si. The active layer 15 has, for example, a multi quantum well (MQW) structure or a single quantum well (SQW) structure. The active layer 15 is formed of a group compound semiconductor, such as GaInAsP or AlGaInAs. The grating layer 17, in which the diffraction grating 17P (see FIGS. 10A and 10B) is to be formed, is of a second conductive type (p-type when the first conductive type is n-type) and is made of, for example, a III-V group compound semiconductor, such as GaInAsP, doped with Zn.

After the stacked-semiconductor-layer forming step, a resin-part forming step, a resin-pattern-portion forming step, and a diffraction-grating forming step are performed, as described below. These steps are performed to transfer the shape of the recesses 3 (shape of the line-and-space pattern 3P) in the pattern surface 1P of the mold 1 onto the grating layer 17.

Resin-Part Forming Step

Figure 3B:
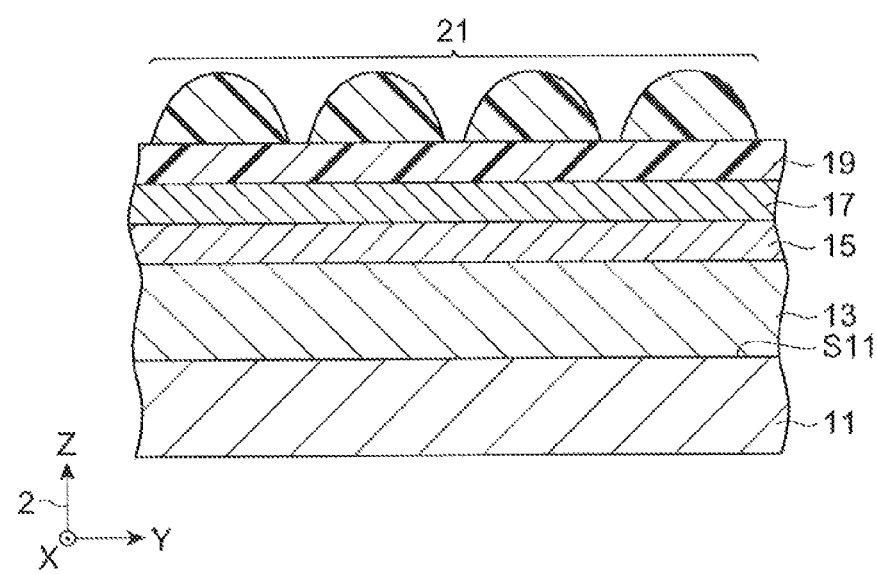
FIG. 3B is a sectional view illustrating a resin-part forming step.

The resin-part forming step is performed after the stacked-semiconductor-layer forming step. In this step, a resin part is formed on the grating layer 17. In the present embodiment, first, as illustrated in FIG. 3B, an insulating layer 19 is formed on the grating layer 17 by a plasma-enhanced chemical vapor deposition (PE-CVD) method. The thickness of the insulating layer 19 may be, for example, 20 nm to 50 nm. The material of the insulating layer 19 may be, for example, a dielectric film of silicon oxynitride (SiON), silicon dioxide ($SiO_2$), or silicon nitride (SiN).

Subsequently, as illustrated in FIG. 3B, a resin part 21 is formed on the insulating layer 19. The resin part 21 may be formed by, for example, applying a resin for forming the resin part 21 to the insulating layer 19 by dispensing. The resin part 21 is formed of a resin that is suitable for a nano-imprint technique. For example, the resin part 21 is made of an ultraviolet (UV) curing resin, a thermosetting resin, or a thermoplastic resin. In the present embodiment, the resin part 21 is preferably made of a silicon-non-containing resin, which substantially does not contain silicon, or a resin in which silicon content in atomic percentage is lower than that in a silicon-containing-resin layer 23 (see FIGS. 6A and 6B), which will be described below. When the silicon content in the resin part 21 is 0.1 at % or less, it can be assumed that the resin part 21 substantially does not contain silicon.

An adhesive layer may be provided between the insulating layer 19 and the resin part 21 to increase the adhesion therebetween. The adhesive layer may be made of for example, a novolac-based resin. The thickness of the adhesive layer may be, for example, 10 nm or more and 300 nm or less.

Resin-Pattern-Portion Forming Step

This step includes a pressing step, a resin-part hardening step, a detaching step, and an inverted-resin-pattern forming step. FIGS. 4A to 8B are sectional views illustrating the resin-pattern-portion forming step.

Pressing Step

Next, the pressing step is performed. In this step, as illustrated in FIGS. 4A and 4B, the pattern surface 1P of the mold 1 is pressed against the resin part 21. At this time, the pattern surface 1P of the mold 1 comes into contact with the resin part 21. FIG. 4B is a sectional view of FIG. 4A taken along line IVB-IVB. In this step, the pattern surface 1P of the mold 1 and the principal surface S11 of the semiconductor substrate 11 are positioned substantially parallel to each other.

In FIGS. 4A and 4B, the mold 1 is drawn such that the second direction of the mold 1, that is, the direction in which the recesses 3 are arranged or the periodic direction of the line-and-space pattern 3P, is along the Y-axis direction. In addition, the mold 1 is drawn such that the first direction of the mold 1, that is, the direction in which each of the recesses 3 extends, is along the X-axis direction.

When the pattern surface 1P of the mold 1 is pressed against the resin part 21, the air around the resin part 21 remains between the resin part 21 and the recesses 3. In addition, gas emerges from the resin part 21. Accordingly, gas bubbles H are trapped between the resin part 21 and the recesses 3, as illustrated in FIG. 4B. The gas bubbles H generally has a spherical shape with a diameter of several nanometers to several tens of nanometers.

As described above, each of the recesses 3 in the mold 1 of the present embodiment includes the two end portions 3E in the first direction (X-axis direction) and the middle portion 3M between the two end portions 3E. The depth T3E of the two end portions 3E from the pattern surface 1P is greater than the depth T3M of the middle portion 3M from the pattern surface 1P (see FIG. 2A). Therefore, the gas bubbles H easily move to the end portions 3E of each of the recesses 3 in the first direction (X-axis direction). More specifically, the gas bubbles H move toward the surfaces 3ES of the mold 1 that define the end portions 3E in each of the recesses 3. In particular, the gas bubbles H can move until they come into contact with the surfaces 3ES.

The above-described pressing step is preferably performed in a reduced-pressure atmosphere. More specifically, preferably, the pressure of the atmosphere around the resin part 21 is reduced before the pattern surface 1P of the mold 1 is pressed against the resin part 21, and then the pattern surface 1P of the mold 1 is pressed against the resin part 21. The pressure of the atmosphere around the resin part 21 may be reduced by, for example, placing the structure including the resin part 21 and the laminate of layers from the semiconductor substrate 11 to the insulating layer 19 in a chamber and reducing the pressure in the chamber using, for example, a vacuum pump. Accordingly, the amount of gas bubbles H trapped between the resin part 21 and the recesses 3 can be reduced.

In the present embodiment, the pattern surface 1P of the mold 1 is pressed against the resin part 21 such that the pattern surface 1P does not come into contact with the layer immediately below the resin part 21, that is, with the insulating layer 19 in the present embodiment. However, the pattern surface 1P of the mold 1 may instead be pressed against the resin part 21 such that the pattern surface 1P conies into contact with the layer immediately below the resin part 21.

Resin-Part Hardening Step

Next, the resin-part hardening step is performed. In this step, the resin part 21 is hardened while the pattern surface 1P of the mold 1 is pressed against the resin part 21, as illustrated in FIGS. 4A and 4B. At this time, the resin part 21 is hardened while the pattern surface 1P of the mold 1 and the resin part 21 are maintained in contact with each other. When the resin part 21 is made of an ultraviolet (UV) curing resin, the resin part 21 is hardened by irradiating the resin part 21 with ultraviolet rays. If the mold 1 is made of a material, such as quartz, that has a high transmittance for ultraviolet rays, the resin part 21 may be irradiated with ultraviolet rays from, for example, above the mold 1. In this case, the ultraviolet rays reach the resin part 21 after passing through the mold 1. When the resin part 21 is made of a thermosetting resin, the resin part 21 is hardened by heating the resin part 21.

Detaching Step

Figure 5A:
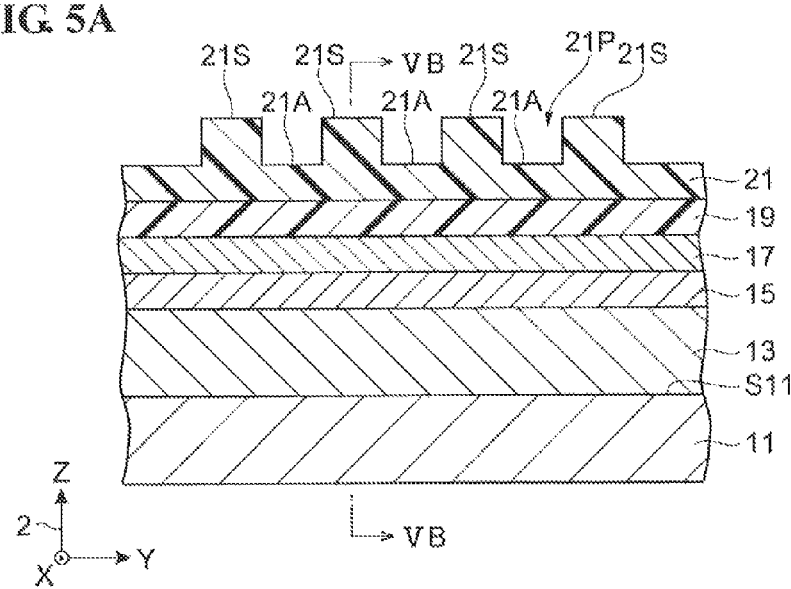
FIGS. 5A and 5B are sectional views illustrating the resin-pattern-portion forming step.
Figure 5B:
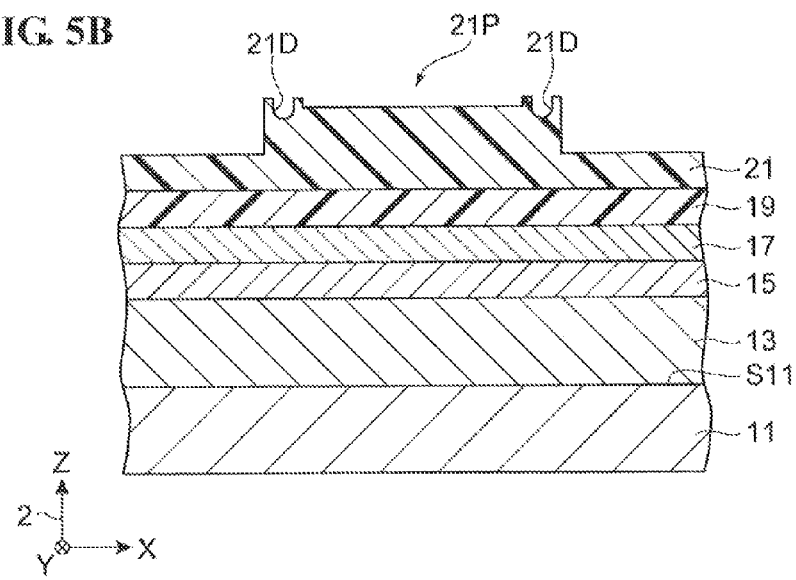

Next, the detaching step is performed. In this step, as illustrated in FIGS. 5A and 5B, the mold 1 and the resin part 21 are detached from each other after the resin part 21 is hardened. Thus, the shape of the recesses 3 in the mold 1, that is, the shape of the line-and-space pattern 3P on the mold 1, is transferred onto the resin part 21. Here, FIG. 5B is a sectional view of FIG. 5A taken along line VB-VB. As a result, a resin pattern portion 21P is formed on the resin part 21.

The resin pattern portion 21P has a periodic structure along a third direction that is parallel to the principal surface S11 of the semiconductor substrate 11. In FIGS. 5A and 5B, the resin part 21 and other elements are drawn such that the third direction is along the Y-axis direction. In other words, the periodic direction of the resin pattern portion 21P is along the Y-axis direction. The third direction is along the second direction of the mold 1 in the step of hardening the resin part 21. For example, the third direction is parallel to the second direction.

The shape of the resin pattern portion 21P corresponds to the line-and-space pattern 3P on the mold 1. The width in the Y-axis direction and the height in the Z-axis direction of line portions of the resin pattern portion 21P are respectively substantially equal to the width in the Y-axis direction and the height in the Z-axis direction of the space portions of the line-and-space pattern 3P on the mold 1. Similarly, the width in the Y-axis direction and the height in the Z-axis direction of space portions of the resin pattern portion 21P are respectively substantially equal to the width in the Y-axis direction and the height in the Z-axis direction of the line portions of the line-and-space pattern 3P on the mold 1.

As illustrated in FIG. 5B, defects 21D are formed in the resin pattern portion 21P owing to the gas bubbles H (see FIG. 4B) trapped between the resin part 21 and the recesses 3. The defects 21D are parts of the resin pattern portion 21P at which the shape of the recesses 3, that is, the shape of the line-and-space pattern 3P, is not appropriately transferred. In the present embodiment, the defects 21D are holes.

As described above, in the pressing step, the gas bubbles H easily move to the end portions 3E of each of the recesses 3 in the first direction (X-axis direction) (sec FIG. 4B). Therefore, the defects 21D tend to be formed at end portions of the resin pattern portion 21P in a direction (X-axis direction) that is orthogonal to the third direction (Y-axis direction).

Inverted-Resin-Pattern Forming Step

Next, the inverted-resin-pattern forming step is performed. In this step, as illustrated in FIGS. 6A and 6B, the silicon-containing-resin layer 23 is formed on the resin part 21 so as to bury projections and recesses of the resin pattern portion 21P therein. FIG. 6B is a sectional view of FIG. 6A taken along line VIB-VIB. The silicon-containing-resin layer 23 may be formed by, for example, applying a silicon-containing resin to the resin part 21 by a spin coating method. An organic silicon compound, such as methylsilsesquioxane, may be used as the material of the silicon-containing-resin layer 23.

Next, as illustrated in FIGS. 7A and 7B, the silicon-containing-resin layer 23 is etched until a surface 21S of the resin pattern portion 21P are exposed in parts of the resin pattern portion 21P that correspond to the middle portions 3M of the recesses 3 in the first direction. FIG. 7B is a sectional view of FIG. 7A taken along line VIIB-VIIB. The etching is performed so that the silicon-containing-resin layer 23 partially remains in the space portions of the resin pattern portion 21P, that is, in recesses 21A in the resin pattern portion 21P. The etching is performed by, for example, a reactive in etching (RIE) method in which gas mixture of fluorocarbon gas ($CF_4$) and oxygen gas ($O_2$) is used as etching gas. In this etching, etching rate of the silicon-containing-resin layer 23 is larger than that of the resin part 21. Therefore, the silicon-containing-resin layer 23 is selectively etched. In addition, the silicon-containing-resin layer 23 remains in the recesses 21A in the resin pattern portion 21P. The silicon-containing-resin layer 23 also partially remains in the defects 21D of the resin pattern portion 21P.

Figure 8A:
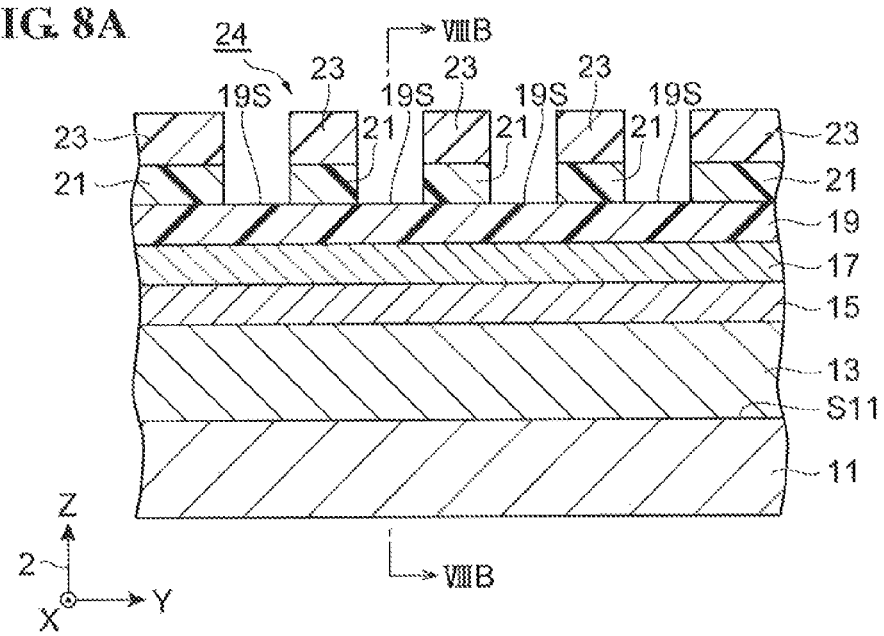
FIGS. 8A and 8B are sectional views illustrating the resin-pattern-portion forming step.
Figure 8B:
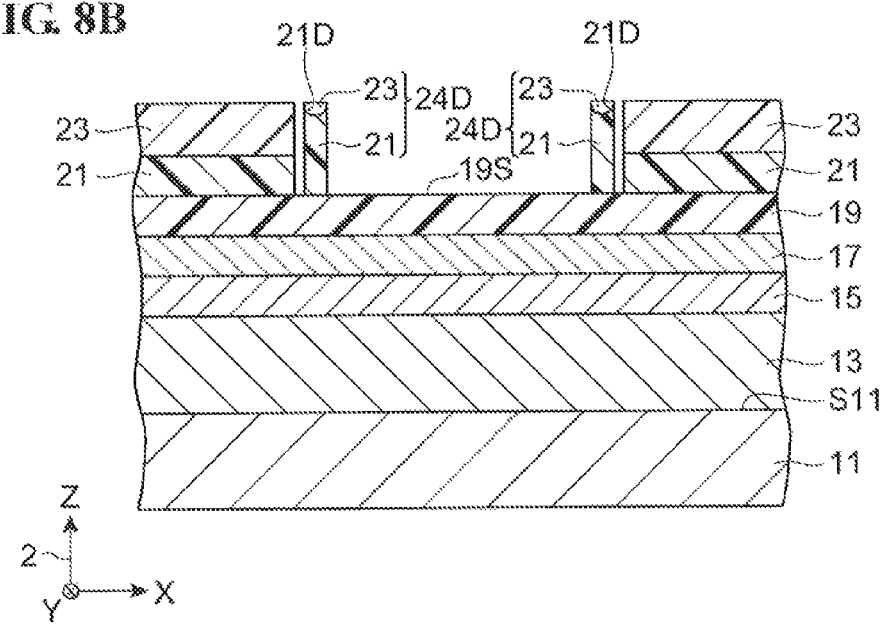

Next, as illustrated in FIGS. 8A and 8B, the resin part 21 is selectively etched to expose parts of a surface 19S of the insulating layer 19 by using the silicon-containing-resin layer 23 as a mask. FIG. 8B is a sectional view of FIG. 8A taken along line VIIIB-VIIIB. The etching is performed by, for example, a reactive ion etching (RIE) method in which gas mixture including oxygen gas ($O_2$) is used as etching gas. In this etching, etching rate of the resin part 21 is larger than that of the silicon-containing-resin layer 23.

Thus, a stacked pattern portion 24 including the resin part 21 and the silicon-containing-resin layer 23 is formed on the insulating layer 19. The shape of the stacked pattern portion 24 corresponds to the shape in which projections and recesses in the resin pattern portion 21P are inverted (inverted shape of the resin pattern portion 21P). Therefore, the stacked pattern portion 24 has a periodic structure along the third direction (Y-axis direction). Thus, an inverted resin pattern portion, which has a shape corresponding to the inverted shape of the resin pattern portion 21P, is formed in the resin part 21.

As illustrated in FIG. 8B, the stacked pattern portion 24 includes defects 24D. The defects 24D of the stacked pattern portion 24 are formed because of the defects 21D of the resin pattern portion 21P. In other words, the defects 24D of the stacked pattern portion 24 are formed because of the gas bubbles H (see FIG. 4B) trapped between the resin part 21 and the recesses 3.

In the present embodiment, the defects 24D of the stacked pattern portion 24 are projections formed because the silicon-containing-resin layer 23 has partially remained in the defects 21D and the resin part 21 under the remaining silicon-containing-resin layer 23 has not been etched.

Diffraction-Grating Forming Step

Figure 9A:
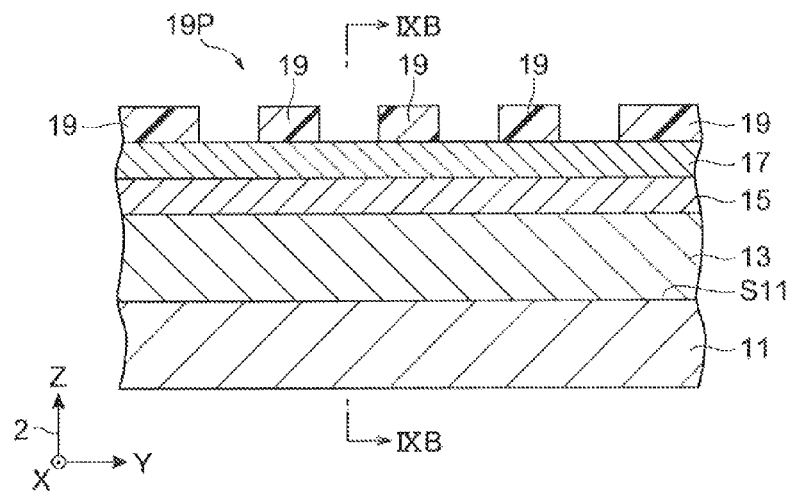
FIGS. 9A and 9B are sectional views illustrating a diffraction-grating forming step.
Figure 9B:
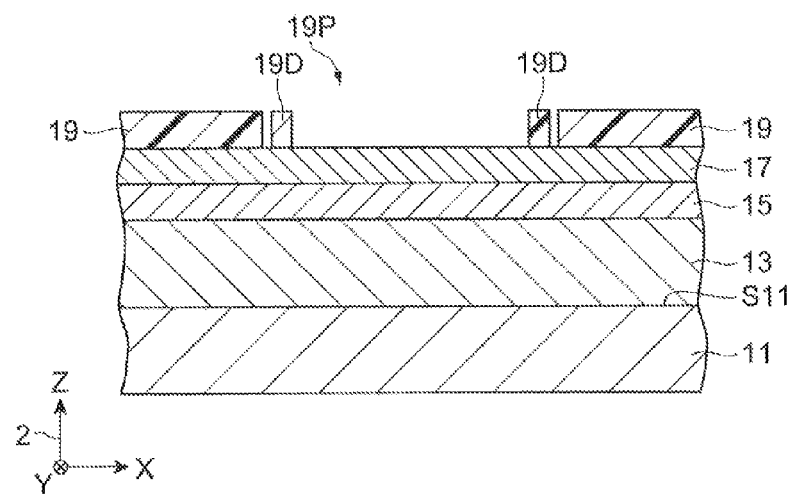

In the diffraction-grating forming step, the shape of the resin pattern portion 21P is transferred onto the grating layer 17. More specifically, first, as illustrated in FIGS. 9A and 9B, the insulating layer 19 is etched by using the stacked pattern portion 24 as a mask until parts of a surface of the grating layer 17 are exposed. Then, the stacked pattern portion 24 is removed. FIG. 9B is a sectional view of FIG. 9A taken along line The etching of the insulating layer 19 may be performed by, for example, a reactive ion etching (RIE) method in which fluorocarbon gas ($CF_4$) is used as etching gas. Then, the stacked pattern portion 24 may be removed by a reactive ion etching (RIE) method in which oxygen gas ($O_2$) is used as etching gas.

Thus, the shape of the resin pattern portion 21P (see FIGS. 5A and 5B) is transferred onto the insulating layer 19. An insulating pattern portion 19P is formed on the insulating layer 19. The shape of the insulating pattern portion 19P corresponds to the shape in which projections and recesses in the resin pattern portion 21P are inverted (inverted shape of the resin pattern portion 21P). Therefore, the insulating pattern portion 19P has a periodic structure along the third direction (Y-axis direction). More specifically, the insulating pattern portion 19P is formed as a line-and-space pattern including a plurality of line portions and space portions. The plurality of line portions extend in the X-axis direction, and have substantially the same width in the Y-axis direction and substantially the same height in the Z-axis direction. The plurality of space portions also extend in the X-axis direction, and have substantially the same width in the Y-axis direction and substantially the same height in the Z-axis direction.

As illustrated in FIG. 9B, the insulating pattern portion 19P includes defects 19D. The defects 19D of the insulating layer 19 are formed because of the defects 21D of the resin part 21 (see FIG. 7B). In other words, the defects 19D are formed because of the gas bubbles H (see FIG. 4B) trapped between the resin part 21 and the recesses 3.

In the present embodiment, the defects 19D of the insulating layer 19 are projections formed because the silicon-containing-resin layer 23 has partially remained in the defects 21D and the resin part 21 under the remaining silicon-containing-resin layer 23 has not been etched (see FIGS. 7B and 8B).

Figure 10A:
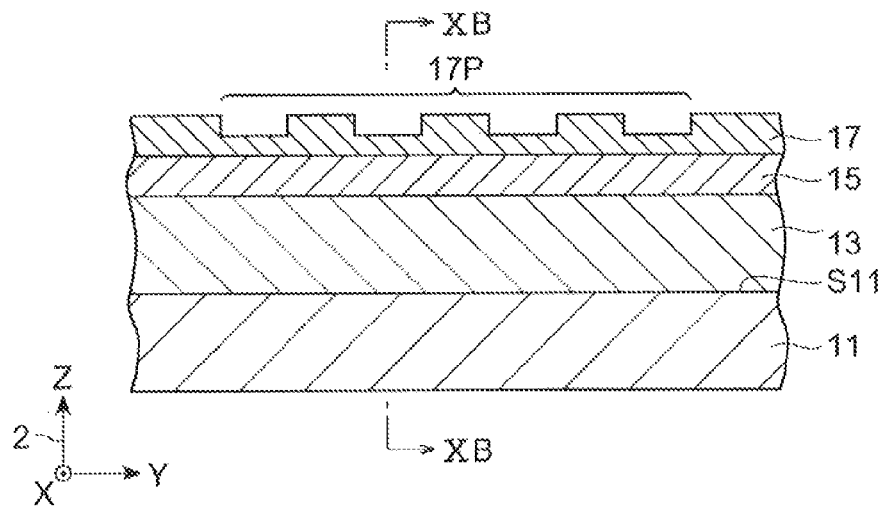
FIGS. 10A and 10B are sectional views illustrating the diffraction-grating forming step.
Figure 10B:
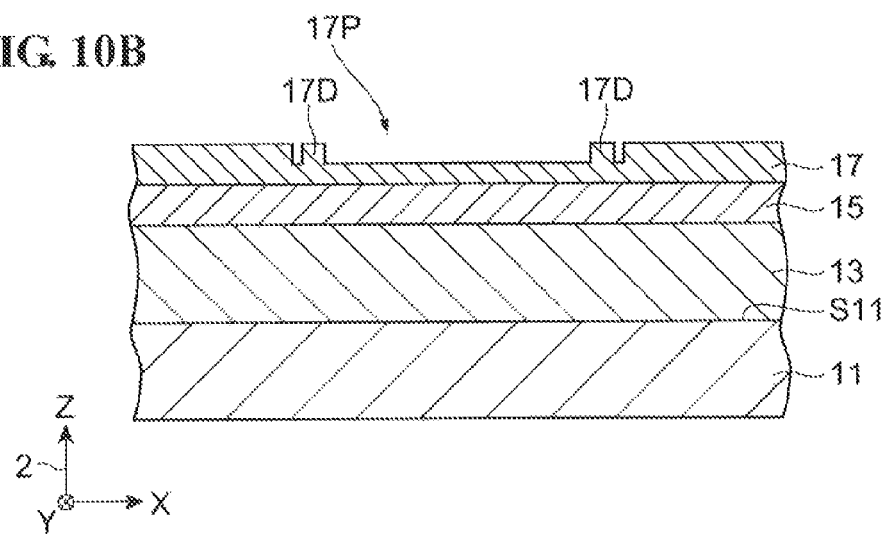

Then, as illustrated in FIGS. 10A and 10B, the parts of the surface of the grating layer 17 are etched to an intermediate position of the grating layer 17 in the thickness direction thereof by using the insulating pattern portion 19P as a mask. FIG. 10B is a sectional view of FIG. 10A taken along line XB-XB. The etching may be performed by, for example, a reactive ion etching (RIE) method in which gas mixture of methane gas and hydrogen gas is used as etching gas.

As a result, the shape of the insulating pattern portion 19P is transferred onto the grating layer 17. Thus, the diffraction grating 17P having a line-and-space pattern is formed in the grating layer 17. The grating layer 17 has a periodic structure along the third direction (Y-axis direction). More specifically, the diffraction grating 17P includes line portions that extend in the X-axis direction and space portions that extend in the X-axis direction. In other words, the diffraction grating 17P has a pattern in which the line portions and the space portions are alternately and periodically arranged in the Y-axis direction.

Thus, the shape of the resin pattern portion 21P (see FIGS. 5A and 5B) of the resin part 21 is transferred onto the grating layer 17. The diffraction grating 17P is formed in the grating layer 17. In the present embodiment, the diffraction grating 17P is formed by transferring the inverted shape of the resin pattern portion 21P onto the grating layer 17.

As illustrated in FIG. 10B, the diffraction grating 17P includes defects 17D. The defects 17D of the diffraction grating 17P are formed because of the defects 21D of the resin part 21 (see FIG. 7B). In other words, the defects 17D are formed because of the gas bubbles H (see FIG. 4B) trapped between the resin part 21 and the recesses 3. Therefore, the defects 17D of the diffraction grating 17P tend to be formed at end portions of the diffraction grating 17P in the direction (X-axis direction) that is orthogonal to the third direction (Y-axis direction). In particular, when the surface 3MS of the mold 1 that defines the middle portion 3M of each of the recesses 3 is inclined with respect to the pattern surface 1P, the gas bubbles H more easily move to at least one of the two end portions 3E of each of the recesses 3 in the first direction. As a result, the defects 17D of the diffraction grating 17P, which are due to the gas bubbles H, tend to be formed more easily at the end portions of the diffraction grating 17P in the direction (X-axis direction) that is orthogonal to the third direction (Y-axis direction).

In the present embodiment, the defects 17D of the diffraction grating 17P are projections formed because the silicon-containing-resin layer 23 has partially remained in the defects 21D and the resin part 21 under the remaining silicon-containing-resin layer 23 has not been etched (see FIGS. 7B and 8B).

Figure 11A:
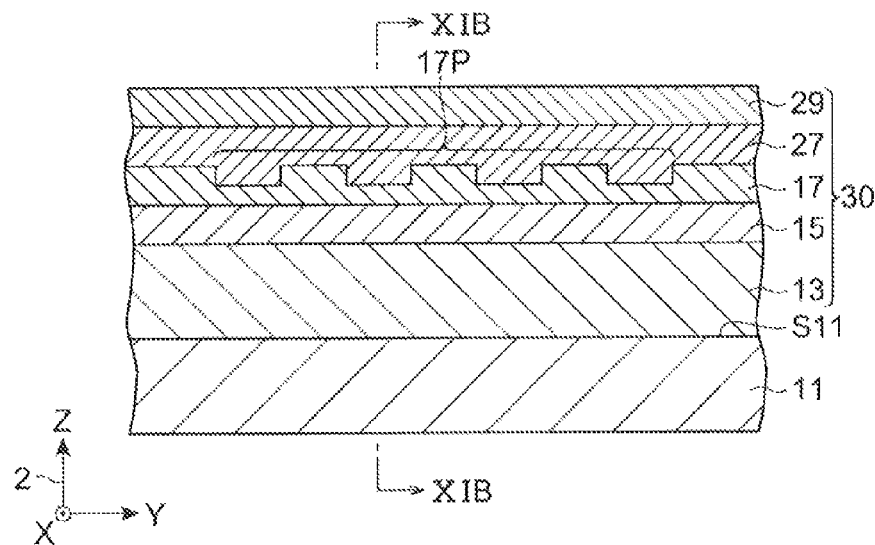
FIGS. 11A and 11B are sectional views illustrating the step of forming a burying layer and a contact layer on the grating layer on which a diffraction grating is formed.
Figure 11B:
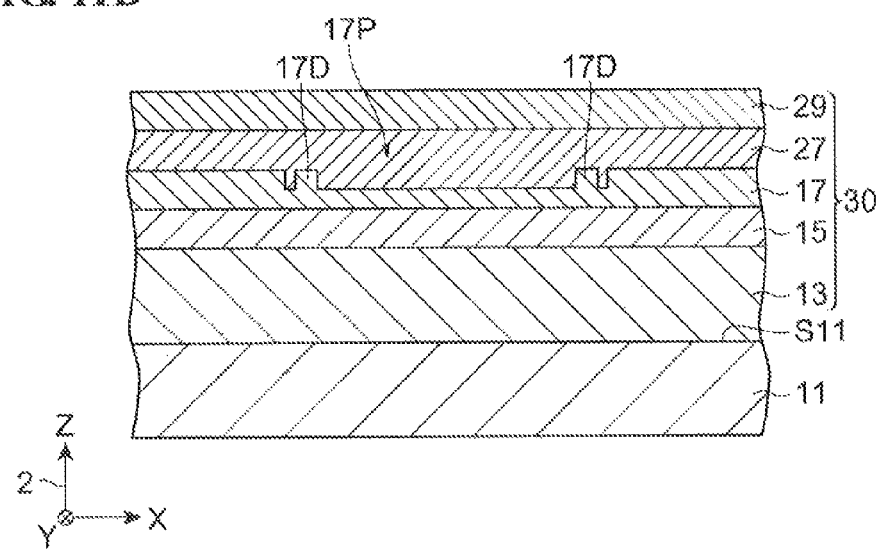

Next, as illustrated in FIGS. 11A and 11B, a burying layer 27 and a contact layer 29 are formed on the grating layer 17 in that order. FIG. 11B is a sectional view of FIG. 11A taken along line XIB-XIB. Thus, a stacked semiconductor layer 30 including the lower cladding layer 13, the active layer 15, the grating layer 17, the burying layer 27, and the contact layer 29 is formed. The stacked semiconductor layer 30 is a stacked body having the structure of a semiconductor laser.

The burying layer 27 and the contact layer 29 may be formed by, for example, a metal-organic vapor phase epitaxy (MOVPE) method. The burying layer 27 is formed so as to bury projections and recesses of the diffraction grating 17P. The burying layer 27 is, for example, a semiconductor layer of the second conductive type. The burying layer 27 is made of, for example, a III-V group compound semiconductor, such as InP, doped with Zn. The burying layer 27 functions as an upper cladding layer. The contact layer 29 is made of, for example, a III-V group compound semiconductor, such as InGaAs, of the second conductive type.

Mesa-Structure Forming Step

Figure 12A:
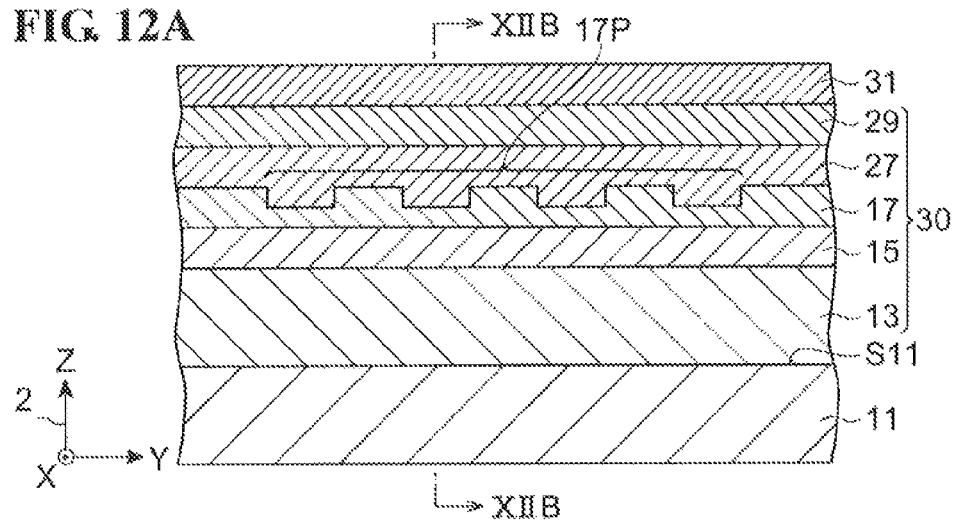
FIGS. 12A and 12B are sectional views illustrating a mesa-structure forming step.
Figure 12B:
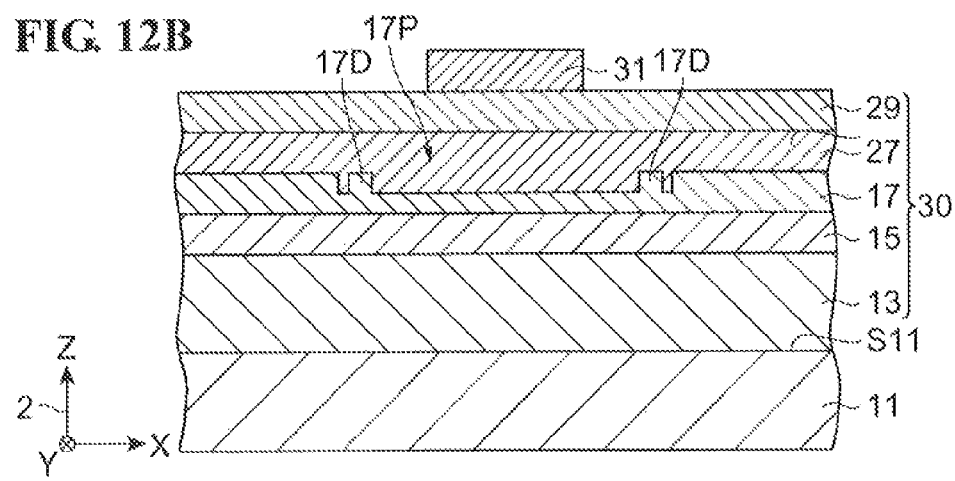
Figure 12C:
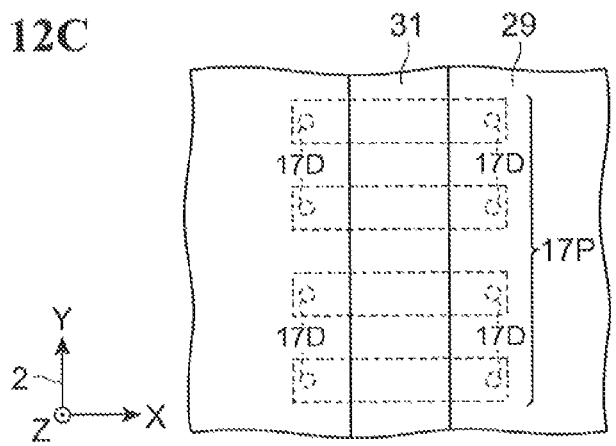
FIG. 12C is a plan view illustrating the mesa-structure forming step.
Figure 13:
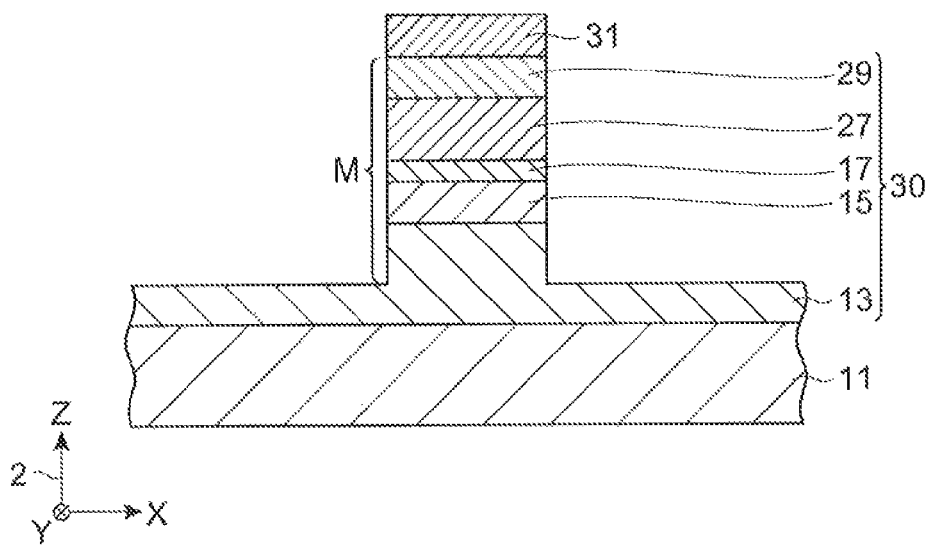
FIG. 13 is a sectional view illustrating the mesa-structure forming step.

The mesa-structure forming step is performed after the stacked-semiconductor-layer forming step. FIGS. 12A, 12B, and 13 are sectional views illustrating the mesa-structure forming step. FIG. 12C is a plan view illustrating the mesa-structure forming step.

In this step, as illustrated in FIGS. 12A, 12B, and 12C, first, the top surface of the stacked semiconductor layer 30 is partially covered with a mask 31. FIG. 12B is a sectional view of FIG. 12A taken along line XIIB-XIIB. FIG. 12C is a top view of FIG. 12B. The mask 31 is formed by, for example, a plasma-enhanced chemical vapor deposition (PE-CVD) method. The mask 31 is formed of, for example, a dielectric film of silicon dioxide ($SiO_2$) or silicon nitride (SiN).

The mask 31 has a stripe shape and extends in the third direction (Y-axis direction). As illustrated in FIGS. 12B and 12C, the mask 31 covers the top surface of the stacked semiconductor layer 30 in an area above a central portion of the diffraction grating 17P in a direction (X-axis direction) that is orthogonal to the third direction. The mask 31 does not cover the top surface of the stacked semiconductor layer 30 in areas over end portions of the diffraction grating 17P in the direction (X-axis direction) that is orthogonal to the third direction.

The above-described mask 31 is formed by, for example, forming the mask 31 on the top surface of the stacked semiconductor layer 30 over the entire area thereof and patterning the mask 31 into the above-described shape. More specifically, a resist is applied to the mask 31 by spin coating, and a stripe-shaped pattern is formed in the resist by photolithography. Then, the pattern in the resist is transferred onto the mask 31 by a reactive ion etching (RIE) method using fluorocarbon gas ($CF_4$). As a result, the above-described mask 31 is formed.

Next, as illustrated in FIG. 13, the stacked semiconductor layer 30 is partially etched by, for example, a reactive ion etching (RIE) method in which the mask 31 is used as a mask and gas mixture of methane gas and hydrogen gas is used as etching gas. The etching is performed so as to remove the end portions of the diffraction grating 17P in the direction (X-axis direction) that is orthogonal to the third direction (Y-axis direction). As a result, the defects 17D of the diffraction grating 17P are removed (see FIGS. 12A to 12C).

In the present embodiment, the stacked semiconductor layer 30 is etched to an intermediate position of the lower cladding layer 13 in the thickness direction thereof. Thus, a mesa portion M including a part of the lower cladding layer 13, the active layer 15, the grating layer 17, the burying layer 27, and the contact layer 29 is formed. The mesa portion M serves as a stripe-shaped mesa structure according to the present embodiment. The mesa portion M projects in a direction that crosses the principal surface S11 of the semiconductor substrate 11 and extends in the third direction (Y-axis direction).

Figure 14:
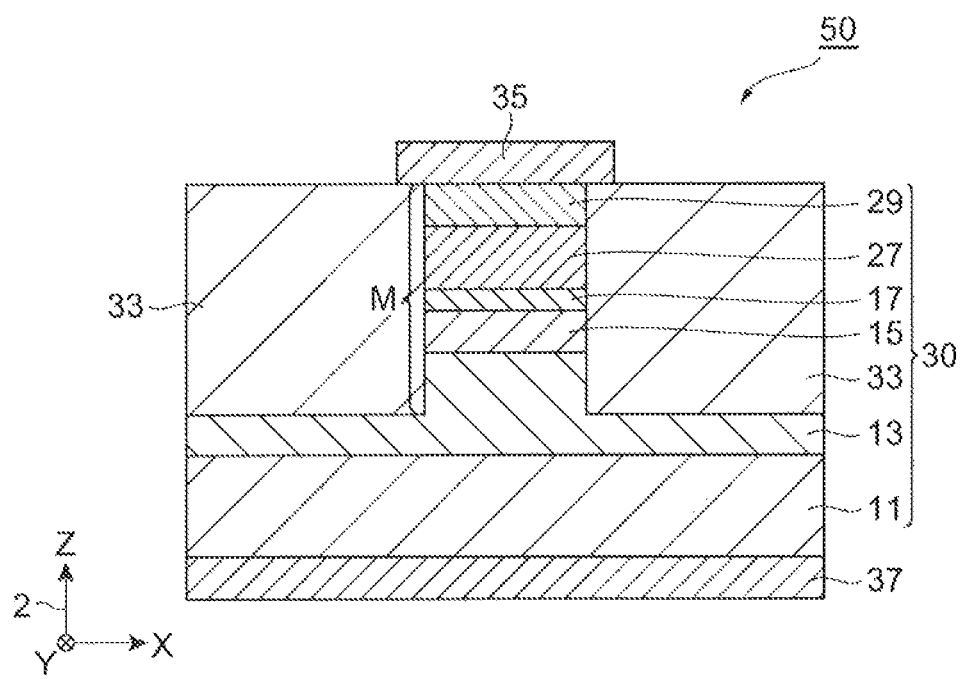
FIG. 14 is a sectional view illustrating the step subsequent to the mesa-structure forming step.

FIG. 14 is a sectional view illustrating the step subsequent to the mesa-structure forming step. As illustrated in FIG. 14, a buried layer 33 is selectively grown by, for example, a metal-organic vapor phase epitaxy (MOVPE) method in which the mask 31 is used as a selective growth mask. Thus, the buried layer 33 is formed so as to bury side surfaces of the mesa portion M. The buried layer 33 may include, for example, a layer of III-V group compound semiconductor, such as InP, of the second conductive type and a layer of III-V group compound semiconductor, such as InP, of the first conductive type. The layer of III-V group compound semiconductor of the second conductive type and a layer of III-V group compound semiconductor of the first conductive type are stacked in this order on the semiconductor substrate 11.

The buried layer 33 serves to confine a current into the active layer 15 in the mesa potion M as a current blocking layer. The buried layer 33 may include a layer of semi-insulating 11'-V group compound semiconductor, such as InP, doped with Fe or the like. Next, as illustrated in FIG. 14, the mask 31 is removed and an upper electrode 35 is formed on the contact layer 29. In addition, a lower electrode 37 is formed on the back surface of the semiconductor substrate 11. Subsequently, the semiconductor substrate 11 is divided into chips. Thus, a distributed feedback laser diode 50 is completed. The resonance direction of the distributed feedback laser diode 50 is along the third direction (Y-axis direction).

In the above-described method for manufacturing the semiconductor laser according to the present embodiment, the recesses 3 in the mold 1 are periodically arranged along the second direction (Y-axis direction) (see FIGS. 1, 2A, and 2B). Therefore, after the stacking step in the stacked-semiconductor-layer forming step, the resin-part forming step, the pressing step, and the resin-pattern-portion forming step, the resin pattern portion 21P having a periodic structure along the third direction (Y-axis direction) is formed on the resin part 21 (see FIGS. 3A to 5B). Here, the third direction (Y-axis direction) is parallel to the principal surface S11 of the semiconductor substrate 11.

Each of the recesses 3 in the mold 1 includes the two end portions 3E in the first direction (X-axis direction) and the middle portion 3M between the two end portions 3E. The depth T3E of the two end portions 3E from the pattern surface 1P is greater than the depth T3M of the middle portion 3M from the pattern surface 1P (see FIG. 2A). When the pattern surface 1P of the mold 1 is pressed against the resin part 21 in the pressing step, the gas bubbles H are trapped between the resin part 21 and the recesses 3 in the mold 1. However, since the mold 1 has the above-described structure, the gas bubbles H easily move to the two end portions (two end portions 3E) of each of the recesses 3 in the first direction (X-axis direction) (see FIGS. 4A and 4B).

Therefore, the defects 21D of the resin pattern portion 21P, which are due to the gas bubbles H, tend to be formed at the end portions of the resin pattern portion 21P in the direction (X-axis direction) that is orthogonal to the third direction (Y-axis direction) (see FIGS. 5A and 5B). The diffraction grating 17P is formed by transferring the shape of the resin pattern portion 21P onto the grating layer 17. Therefore, the defects 17D of the diffraction grating 17P, which are clue to the gas bubbles H, tend to be formed at the end portions of the diffraction grating 17P in the direction (X-axis direction) that is orthogonal to the third direction (Y-axis direction) (see FIGS. 10A and 10B).

In the etching step in the mesa-structure forming step, the stacked semiconductor layer 30 is etched so as to remove the end portions of the diffraction grating 17P in the direction (X-axis direction) that is orthogonal to the third direction (Y-axis direction) (see FIGS. 12A to 12C and 13). Therefore, the defects 17D of the diffraction grating 17P, which are due to the gas bubbles H, can be easily removed when the stacked semiconductor layer 30 is etched. As a result, in the resulting distributed feedback laser diode 50, the defects of the diffraction grating 17P due to the gas bubbles H can be reduced (see FIG. 14).

In addition, in the method for manufacturing the semiconductor laser according to the present embodiment, the surface 3MS of the mold 1 that defines the middle portion 3M of each of the recesses 3 is substantially parallel to the pattern surface 1P (see FIGS. 2A and 2B). Accordingly, in the resin pattern portion 21P formed by transferring the shape of the recesses 3 onto the resin part 21, the depth distribution of each of the recesses 21A in the resin pattern portion 21P can be made uniform (see FIGS. 5A and 5B). As a result, when the diffraction grating 17P is formed in the grating layer 17 by transferring the shape of the resin pattern portion 21P onto the grating layer 17, the depth distribution of each of the recesses in the diffraction grating 17P can be made uniform (see FIGS. 10A and 10B).

In addition, in the method for manufacturing the semiconductor laser according to the present embodiment, the pressing step is preferably performed in a reduced-pressure atmosphere, as described above (see FIGS. 3A, 3B, 4A, and 4B). Accordingly, when the pattern surface 1P of the mold 1 is pressed against the resin part 21 in the pressing step, the amount of gas bubbles H trapped between the resin part 21 and the recesses 3 in the mold 1 can be reduced. As a result, the defects of the diffraction grating 17P can be more effectively reduced.

In addition, in the method for manufacturing the semiconductor laser according to the present embodiment, the stacking step includes the step of stacking the insulating layer 19 on the grating layer 17. The resin part 21 is formed of a silicon-non-containing resin. In the resin-part forming step, the resin part 21 is formed on the insulating layer 19. In addition, the diffraction-grating forming step includes a silicon-containing-resin-layer forming step, a silicon-containing-resin-layer etching step, a resin-part etching step, an insulating-layer etching step, and a grating-layer etching step (see FIGS. 3A to 10B). In the silicon-containing-resin-layer forming step, the silicon-containing-resin layer 23 is formed on the resin part 21 so as to bury projections and recesses of the resin pattern portion 21P. In the silicon-containing-resin-layer etching step, the silicon-containing-resin layer 23 is selectively etched so that the surface 21S of the resin pattern portion 21P is exposed while the silicon-containing-resin layer 23 remains in the recesses 21A. In the resin-part etching step, the resin part 21 is selectively etched to expose parts of the surface 19S of the insulating layer 19 by using the silicon-containing-resin layer 23 that remains in the recesses 21A in the resin pattern portion 21P as a mask. In the insulating-layer etching step, which is performed after the resin-part etching step, the insulating layer 19 is selectively etched to expose parts of the surface of the grating layer 17 by using the silicon-containing-resin layer 23 and the resin part 21 as a mask. In the grating-layer etching step, which is performed after the insulating-layer etching step, the parts of the surface of the grating layer 17 that have been exposed in the insulating-layer etching step are etched by using the insulating layer 19 as a mask. As a result, the inverted shape of the resin pattern portion 21P formed in the resin-pattern-portion forming step is transferred onto the grating layer 17.

To transfer the inverted shape of the resin pattern portion 2W onto the grating layer 17, first, the silicon-containing-resin layer 23, the resin part 21 made of a silicon-non-containing resin, and the insulating layer 19 are selectively etched in that order by using the differences in etching rate of the etched materials between the silicon-containing-resin layer 23, the resin part 21, and the insulating layer 19. As a result, the inverted shape of the resin pattern portion 21P is transferred onto the insulating layer 19 (the silicon-containing-resin-layer etching step, the resin-part etching step, and the insulating-layer etching step (see FIGS. 6A to 9B)). Subsequently, the grating layer 17 is etched by using the insulating layer 19 as a mask. Thus, the inverted shape of the resin pattern portion 21P formed in the resin-pattern-portion forming step is transferred onto the grating layer 17. As a result, the diffraction grating can be formed on the grating layer (grating-layer etching step).

As described above, the silicon-containing-resin layer 23, the resin part 21, and the insulating layer 19 are selectively etched. Owing to this selective etching, even when the surface 3MS of the mold 1 that defines the middle portion 3M of each of the recesses 3 is inclined with respect to the pattern surface 1P, as described below (see FIGS. 18A and 18B), the depth distribution of each of the recesses in the diffraction grating 17P formed in the grating layer 17 can be made substantially uniform.

More specifically, in the present embodiment, the projection-and-recess pattern for forming the diffraction grating is formed on the pattern surface 1P of the mold 1. The projection-and-recess pattern is transferred onto the resin part 21, and the silicon-containing-resin layer 23 is formed on the resin part 21 so as to fill the recesses in the resin pattern portion 21P of the resin part 21 (see FIGS. 6A and 6B). Then, the silicon-containing-resin layer 23 is etched to expose the surface of the resin pattern portion 21P. At this time, only the recesses 21A in the resin pattern portion 21P are filled with the silicon-containing-resin layer 23. Subsequently, the resin part 21 is etched and the stacked pattern portion 24 having a shape that corresponds to the inverted shape of the resin pattern portion 21P is formed (see FIGS. 8A and 8B). Therefore, even when the surface 3MS of the mold 1 is inclined as described below (see FIGS. 18A and 18B), the depth of each of the recesses in the stacked pattern portion 24 is not affected by the inclination of the surface 3MS, and can be made substantially uniform. As a result, the depth of each of the recesses in the insulating pattern portion 19P formed on the insulating layer 19 can also be made substantially uniform. Therefore, the depth distribution of each of the recesses in the diffraction grating 17P formed in the grating layer 17 can be made substantially uniform. Thus, the present embodiment is also suitable for application to the mold 1 in which the surface 3MS that defines the middle portion 3M is inclined.

As described above, the step of forming the stacked pattern portion 24 including the resin part 21 and the silicon-containing-resin layer 23 may be performed. In this case, even when the mold 1 in which the surface 3MS thereof is inclined with respect to the pattern surface 1P is used, as described below (see FIGS. 18A and 18B), the diffraction grating 17P including recesses which each have a substantially uniform depth distribution can be formed by etching the grating layer 17 using the stacked pattern portion 24 as a mask. When the surface 3MS of the mold 1 is inclined, the gas bubbles H more easily move to at least one of the two end portions 3E of each of the recesses 3 in the first direction. Therefore, the defects 17D of the diffraction grating 17P, which are due to the gas bubbles H, tend to be formed more easily at the end portions of the diffraction grating 17P in the direction (X-axis direction) that is orthogonal to the third direction (Y-axis direction). Then, the defects 17D formed at the end portions of the diffraction grating 17P are removed in the mesa-structure forming step. As a result, the defects 17D of the diffraction grating 17P can be effectively reduced.

In the present embodiment, the insulating layer 19 is formed on the grating layer 17. Subsequently, the resin part 21 is formed on the insulating layer 19. However, the resin part 21 may be formed directly on the grating layer 17 without forming the insulating layer 19. In this case, in the inverted-resin-pattern forming step, the resin part 21 is etched by using the silicon-containing-resin layer 23 that remains in the recesses 21A in the resin pattern portion 21P as a mask until a part of a surface of the grating layer 17 is exposed. An inverted resin pattern portion having an inverted shape of the resin pattern portion 21P is formed on the resin part 21. Then, in the diffraction-grating forming step, the grating layer 17 is etched by using the resin part 21 having the inverted resin pattern portion as a mask.

Second Embodiment

A method for manufacturing a semiconductor laser according to a second embodiment will now be described. In the present embodiment, a resin-part forming step, a resin-pattern-portion forming step, and a diffraction-grating forming step differ from those of the first embodiment.

Figure 16A:
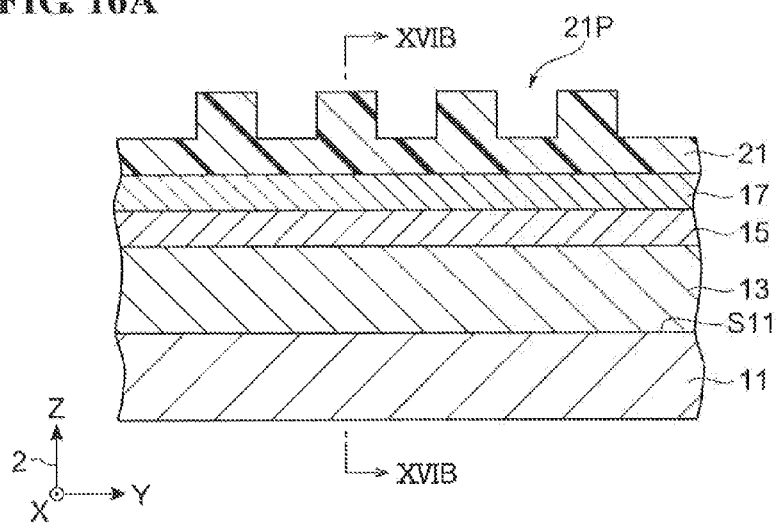
FIGS. 16A and 16B are sectional views illustrating a resin-pattern-portion forming step according to the second embodiment.
Figure 16B:
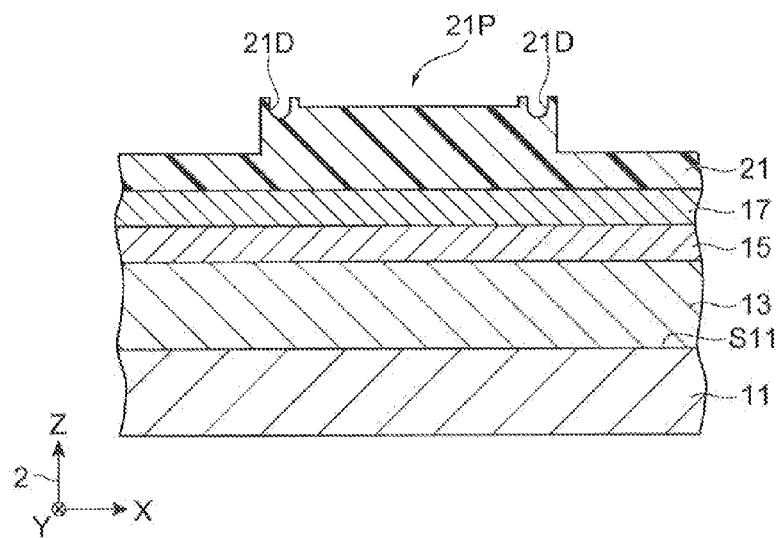

In the present embodiment, as illustrated in FIGS. 15A and 15B, the resin part 21 is formed directly on the grating layer 17 without forming the insulating layer 19 (see FIG. 3B) on the grating layer 17 in the resin-part forming step. FIG. 15B is a sectional view of FIG. 15A taken along line XVB-XVB. As illustrated in FIGS. 15A and 15B, the pattern surface 1P of the mold 1 is pressed against the resin part 21. Next, the resin part 21 is hardened in that state. Accordingly, as illustrated in FIGS. 16A and 16B, the resin pattern portion 21P is formed on the resin part 21, similar to the first embodiment. FIG. 16B is a sectional view of FIG. 16A taken along line XVIB-XVIB.

Figure 17A:
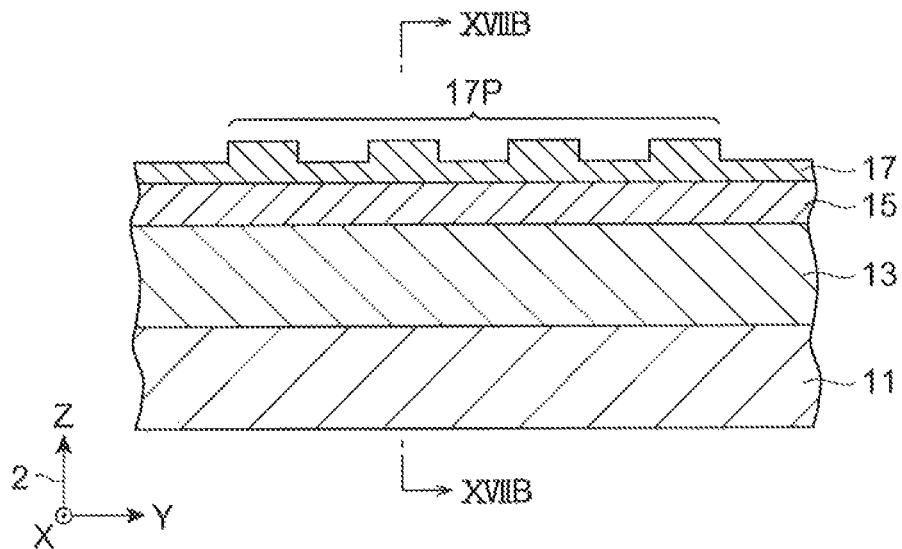
FIGS. 17A and 17B are sectional views illustrating a diffraction-grating forming step according to the second embodiment.
Figure 17B:
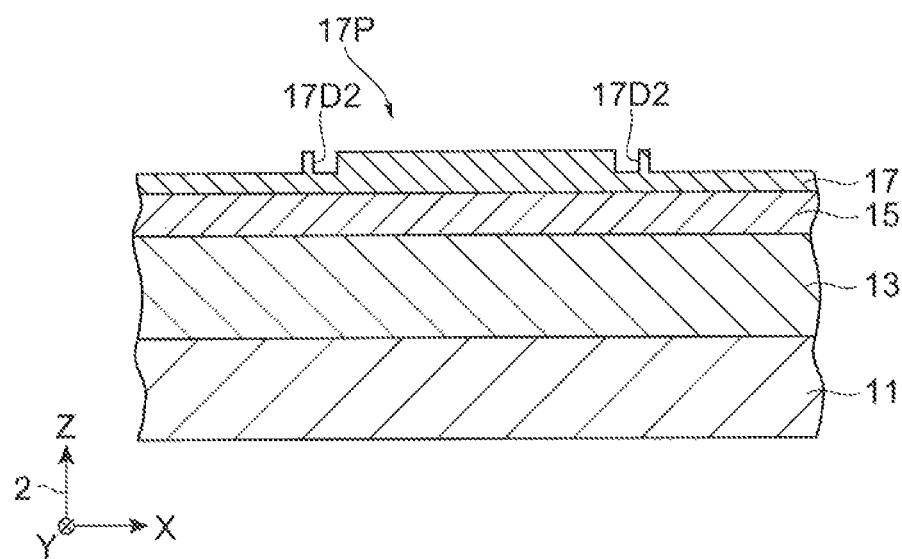

Then, as illustrated in FIGS. 17A and 17B, the resin part 21 is etched until parts of the grating layer 17 are exposed. The etching is performed by, for example, a reactive ion etching (RIE) method in which gas mixture of fluorocarbon gas ($CF_4$) and oxygen gas ($O_2$) is used as etching gas. Next, the parts of the grating layer 17 are etched by a reactive ion etching (RIE) method in which gas mixture of methane gas and hydrogen gas is used as etching gas. Accordingly, the shape of the resin pattern portion 21P is transferred onto the grating layer 17. Thus, the diffraction grating 17P is formed in the grating layer 17. FIG. 17B is a sectional view of FIG. 17A taken, along line XVIIB-XVIIB. In the present embodiment, the diffraction grating 17P is formed in the grating layer 17 by transferring the non-inverted shape of the resin pattern portion 21P onto the grating layer 17.

The etching may instead be performed by, for example, an ion milling method using Ar gas. In the etching using the ion milling method, the resin part 21 and the grating layer 17 can be etched at substantially the same etching rate. Therefore, the shape that is similar to the shape of the resin pattern portion 21P formed on the resin part 21 can be directly transferred onto the grating layer 17. In this case, the mold 1 in which the surface 3MS that defines the middle portion 3M of each of the recesses 3 is substantially parallel to the pattern surface 1P is preferably used. When such a mold 1 is used, the depth of the recesses in the diffraction grating 17P formed in the grating layer 17 can be made substantially uniform. More specifically, the depth of recesses at a central area in the X-axis direction in which a stripe-shaped mesa structure to be formed, can be made substantially uniform.

Similar to the grating layer 17 of the first embodiment, the grating layer 17 of the present embodiment has a periodic structure along the third direction (Y-axis direction). More specifically, the diffraction grating 17P includes line portions that extend in the X-axis direction and space portions that extend in the X-axis direction. In other words, the diffraction grating 17P has a pattern in which the line portions and the space portions are alternately and periodically arranged in the Y-axis direction.

Defects of the diffraction grating 17P according to the present embodiment are different from the defects 17D (see FIG. 10B) of the diffraction grating 17P according to the first embodiment. More specifically, defects 17D2 of the diffraction grating 17P according to the present embodiment are recessed.

According to the method for manufacturing the semiconductor laser of the present embodiment, for a reason similar to that in the method for manufacturing the semiconductor laser of the first embodiment, the defects of the diffraction grating 17P due to the gas bubbles H can be reduced in the distributed feedback laser diode 50 (see FIG. 14).

In this embodiment, the resin part 21 is formed directly on the grating layer 17 without forming the insulating layer 19 on the grating layer 17 in the resin-part forming step. However, in the resin-part forming step, the insulating layer 19 may be formed on the grating layer 17. Then, the resin part 21 is formed on the insulating layer 19. In addition, in the diffraction-grating forming step, the insulating layer 19 is etched by using the resin part 21 on which the resin pattern portion 21P is formed as a mask until a part of a surface of the grating layer 17 is exposed. Accordingly, the shape of the resin pattern portion 21P is transferred onto the insulating layer 19. A patterned insulating layer is formed on the grating layer 17. Then, the grating layer 17 is etched by using the patterned insulating layer as a mask. Thus, the diffraction grating 17P is formed in the grating layer 17.

The present invention is not limited to the above-described embodiments, and various modifications are possible.

For example, the recesses 3 in the mold 1 are not limited to those in the above-described embodiments. Specifically, the depth of at least one of the two end portions 3E from the pattern surface 1P may be greater than the depth of the middle portion 3M from the pattern surface 1P.

In addition, the surface 3MS of the mold 1 that defines the middle portion 3M of each of the recesses 3 may have an area which includes at least one of the ends (first end 3MSE1 and second 3MSE2) in the first direction and in which the depth from the pattern surface 1P increases toward the at least one of the ends along the first direction.

Figure 18A:
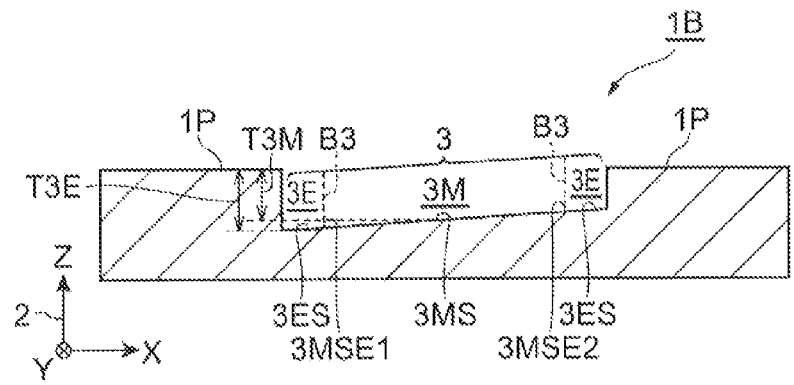
FIGS. 18A and 18B are sectional views illustrating modifications of recesses in the mold.
Figure 18B:
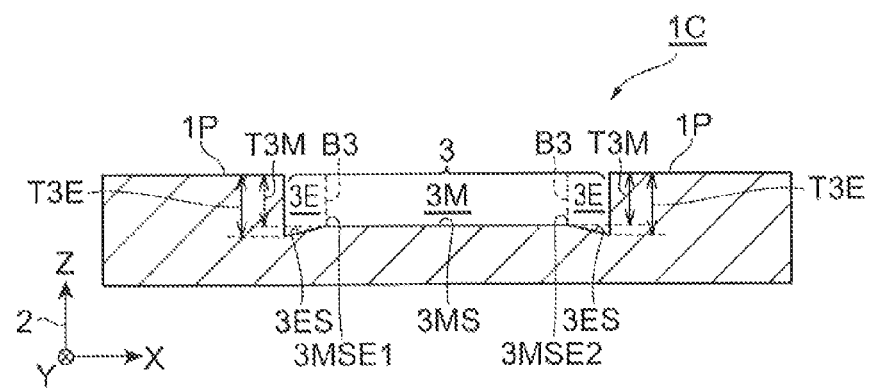

This will be further described with reference to FIGS. 18A and 18B. FIGS. 18A and 18B are sectional views illustrating modifications of the recesses 3 in the mold 1. FIGS. 18A and 18B are diagrams corresponding to FIG. 2A, which illustrates the above-described embodiment. For example, as illustrated in FIG. 18A, in a cross section perpendicular to the second direction (Y-axis direction), the surface of the mold 1 that defines each of the recesses 3 (the surfaces 3ES that define the two end portions 3E and the surface 3MS that defines the middle portion 3M) may be formed such that the depth thereof from the pattern surface 1P monotonously decreases from one end toward the other end in the first direction (X-axis direction). Thus, the surface 3MS of the mold 1 that defines the middle portion 3M of each of the recesses 3 may have an area which includes the first end 3MSE1 and in which the depth T3M from the pattern surface 1P increases toward the first end 3MSE1 along the first direction.

In this case, when the pattern surface 1P of the mold 1 is pressed against the resin part 21 in the pressing step, the gas bubbles H that have been trapped between the resin part 21 and the recesses 3 in the mold 1 more easily move to at least one of the two end portions 3E of each of the recesses 3 in the first direction.

Alternatively, the surface 3MS of the mold 1 that defines the middle portion 3M of each of the recesses 3 may have a first area which includes the first end 3MSE1 and in which the depth T3M from the pattern surface 1P increases toward the first end 3MSE along the first direction and a second area which includes the second end 3MSE2 and in which the depth T3M from the pattern surface 1P increases toward the second end 3MSE2 along the first direction.

In this case, when the pattern surface 1P of the mold 1 is pressed against the resin part 21 in the pressing step, the gas bubbles H that have been trapped between the resin part 21 and the recesses 3 in the mold 1 more easily move to the two end portions 3E of each of the recesses 3 in the first direction.

In addition, at least one of the surfaces 3ES of the mold 1 that define the two end portions 3E in each of the recesses 3 may be inclined with respect to the pattern surface 1P in the first direction. More specifically, as illustrated in FIG. 18B, the surface 3MS that defines the middle portion 3M of each of the recesses 3 in the first direction (X-axis direction) may be substantially parallel to the pattern surface 1P, and the surfaces that define the two end portions 3E of each of the recesses 3 in the first direction (X-axis direction) may be non-parallel to the pattern surface 1P.

In this case, when the pattern surface 1P of the mold 1 is pressed against the resin part 21 in the pressing step, the gas bubbles H that have been trapped between the resin part 21 and the recesses 3 in the mold 1 more easily move to at least one of the two end portions 3E of each of the recesses 3 in the first direction.

In the above-described embodiments, the diffraction grating 17P (grating layer 17) is formed on the upper side of the active layer 15 (see FIGS. 10A and 10B). However, the diffraction grating 17P (grating layer 17) may instead be formed on the lower side of the active layer 15. In addition, in the above-described embodiments, the diffraction grating 17P has a periodic structure. However, the diffraction grating 17P may instead be a chirped grating or a sampled grating.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing a semiconductor laser, the method comprising the steps of:
   preparing a mold having a pattern surface on which a pattern including a plurality of recesses is formed;
   forming a stacked semiconductor layer on a principal surface of a substrate, the stacked semiconductor layer including an active layer and a grating layer;
   forming a resin part on the grating layer;
   forming a resin pattern portion having recesses on the resin part by transferring the pattern formed on the pattern surface of the mold onto the resin part by a nano-imprint technique using the mold;
   forming a diffraction grating in the grating layer by etching the grating layer using the resin part on which the resin pattern portion is formed as a mask; and
   forming a mesa-structure on the stacked semiconductor layer by etching the stacked semiconductor layer,
   wherein the recesses in the mold extend in a first direction that is parallel to the pattern surface and are periodically arranged in a second direction that is orthogonal to the first direction, each of the recesses in the mold including two end portions in the first direction and a middle portion between the two end portions, a depth of at least one of the two end portions from the pattern surface being greater than a depth of the middle portion from the pattern surface,
   wherein, in the step of forming the resin pattern portion, the recesses formed in the resin part are periodically arranged in a third direction that is parallel to the principal surface of the substrate,
   wherein, in the step of forming the diffraction grating, the diffraction grating has two end portions in a direction orthogonal to the third direction corresponding to the pattern formed on the pattern surface of the mold, and
   wherein the step of forming the mesa-structure includes the steps of:
   covering a part of a top surface of the stacked semiconductor layer with a mask that does not cover the top surface of the stacked semiconductor layer over the end portions of the diffraction grating, the mask extending in the third direction, and
   etching the stacked semiconductor layer using the mask so as to remove the end portions of the diffraction grating.

2. The method according to claim 1,
   wherein the step of forming the resin pattern portion on the resin part includes the steps of:
   pressing the pattern surface of the mold against the resin part,
   hardening the resin part while the resin part and the pattern surface of the mold are maintained in contact with each other, and
   detaching the mold and the resin part from each other.

3. The method according to claim 2,
   wherein the step of pressing the pattern surface of the mold against the resin part is performed in a reduced-pressure atmosphere.

4. The method according to claim 1,
   wherein a surface of the mold that defines the middle portion of each of the recesses is substantially parallel to the pattern surface.

5. The method according to claim 1,
   wherein a surface of the mold that defines the middle portion of each of the recesses includes an area including at least one of ends of the surface in the first direction, and
   wherein each of the recesses in the mold has a shape such that a depth thereof from the pattern surface in the area increases toward the at least one of the ends along the first direction.

6. The method according to claim 1,
   wherein a surface of the mold that defines at least one of the two end portions of each of the recesses is inclined with respect to the pattern surface in the first direction.

7. The method according to claim 1,
   wherein the step of forming the resin part includes the step of forming an insulating layer on the grating layer, the resin part being formed on the insulating layer, and
   wherein the step of forming the diffraction grating in the grating layer includes the steps of:
   etching the insulating layer using the resin part on which the resin pattern portion is formed as a mask until a part of a surface of the grating layer is exposed, and
   etching the grating layer using the insulating layer as a mask.

8. The method according to claim 1,
   wherein the resin part is made of a silicon-non-containing resin,
   wherein the step of forming the resin pattern portion includes the steps of:
   forming a silicon-containing-resin layer on the resin part, the silicon-containing-resin layer filling the recesses formed in the resin pattern portion,
   etching the silicon-containing-resin layer until a surface of the resin pattern portion is exposed while the silicon-containing-resin layer remains in the recesses in the resin pattern portion, and
   forming an inverted resin pattern portion, which has an inverted shape of the resin pattern portion, on the resin part by etching the resin part using the silicon-containing-resin layer that remains in the recesses in the resin pattern portion as a mask until a part of a surface of the grating layer is exposed, and wherein the step of forming the diffraction grating in the grating layer includes the step of etching the grating layer using the resin part having the inverted resin pattern portion as a mask.

9. The method according to claim 1, wherein the resin part is made of a silicon-non-containing resin, wherein the step of forming the resin part includes the step of forming an insulating layer on the grating layer, the resin part being formed on the insulating layer, wherein the step of forming the resin pattern portion includes the steps of:
  forming a silicon-containing-resin layer on the resin part, the silicon-containing-resin layer filling the recesses formed in the resin pattern portion,
  etching the silicon-containing-resin layer until a surface of the resin pattern portion is exposed while the silicon-containing-resin layer remains in the recesses in the resin pattern portion, and
  forming an inverted resin pattern portion, which has an inverted shape of the resin pattern portion, on the resin part by etching the resin part using the silicon-containing-resin layer that remains in the recesses in the resin pattern portion as a mask until a part of a surface of the insulating layer is exposed, and wherein the step of forming the diffraction grating in the grating layer includes the steps of:
  etching the insulating layer using the resin part having the inverted resin pattern portion as a mask until a part of a surface of the grating layer is exposed, and
  etching the grating layer using the insulating layer as a mask.

\* \* \* \* \*